United States Patent
Lee et al.

(10) Patent No.: US 10,622,091 B2
(45) Date of Patent: Apr. 14, 2020

(54) NONVOLATILE MEMORY DEVICE AND MEMORY SYSTEM INCLUDING THE SAME

(71) Applicant: Samsung Electronics Co., Ltd., Suwon-si, Gyeonggi-do (KR)

(72) Inventors: Ho-Jun Lee, Uiwang-si (KR); Bong-Soon Lim, Seoul (KR); Sang-Won Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/824,068

(22) Filed: Nov. 28, 2017

(65) Prior Publication Data
US 2018/0268921 A1 Sep. 20, 2018

(30) Foreign Application Priority Data
Mar. 20, 2017 (KR) .......................... 10-2017-0034938

(51) Int. Cl.
*G11C 29/00* (2006.01)
*G06F 12/02* (2006.01)

(52) U.S. Cl.
CPC ........ *G11C 29/765* (2013.01); *G06F 12/0246* (2013.01); *G11C 29/88* (2013.01); *G11C 29/883* (2013.01); *G06F 2212/7201* (2013.01); *G06F 2212/7204* (2013.01)

(58) Field of Classification Search
None
See application file for complete search history.

(56) References Cited

U.S. PATENT DOCUMENTS

| | | | |
|---|---|---|---|
| 7,295,479 B2 | 11/2007 | Yoon et al. | |
| 7,916,540 B2 | 3/2011 | Byeon | |
| 7,970,985 B2 | 6/2011 | Gonzalez et al. | |
| 8,239,714 B2 | 8/2012 | Flynn et al. | |
| 8,732,519 B2 | 5/2014 | Sun et al. | |
| 8,832,507 B2 | 9/2014 | Post et al. | |
| 8,879,295 B1 | 11/2014 | Barth, Jr. et al. | |
| 9,418,700 B2 | 8/2016 | Ramanujan et al. | |
| 9,460,815 B2 | 10/2016 | Sivasankaran et al. | |
| 2002/0105840 A1* | 8/2002 | Ikeda ................ | G11C 29/76 365/200 |
| 2003/0081471 A1* | 5/2003 | Takase ............... | G11C 29/808 365/200 |

(Continued)

FOREIGN PATENT DOCUMENTS

KR 100923989 10/2009

*Primary Examiner* — Douglas King
(74) *Attorney, Agent, or Firm* — Onello & Mello, LLP

(57) ABSTRACT

A nonvolatile memory device includes a memory cell array and a bad block remapping circuit. The memory cell array includes a first mat and a second mat that are paired with each other. The first mat includes a plurality of first memory blocks. The second mat includes a plurality of second memory blocks. A first selection memory block among the plurality of first memory blocks and a second selection memory block among the plurality of second memory blocks are accessed based on a first address. The bad block remapping circuit generates a first remapping address based on the first address when it is determined that the first selection memory block is defective. A first remapping memory block among the plurality of first memory blocks and the second selection memory block are accessed based on the first remapping address.

19 Claims, 20 Drawing Sheets

(56) References Cited

U.S. PATENT DOCUMENTS

| | | | |
|---|---|---|---|
| 2009/0292944 A1* | 11/2009 | Gonzalez | G06F 12/0246 |
| | | | 714/5.1 |
| 2010/0046292 A1* | 2/2010 | Hahn | G11C 29/76 |
| | | | 365/185.09 |
| 2010/0269000 A1 | 10/2010 | Lee | |
| 2011/0219260 A1 | 9/2011 | Nobunaga et al. | |
| 2012/0084611 A1 | 4/2012 | Flynn et al. | |
| 2015/0187442 A1 | 7/2015 | Sivasankaran et al. | |
| 2015/0220441 A1* | 8/2015 | Eggleston | G06F 12/0246 |
| | | | 711/103 |

* cited by examiner

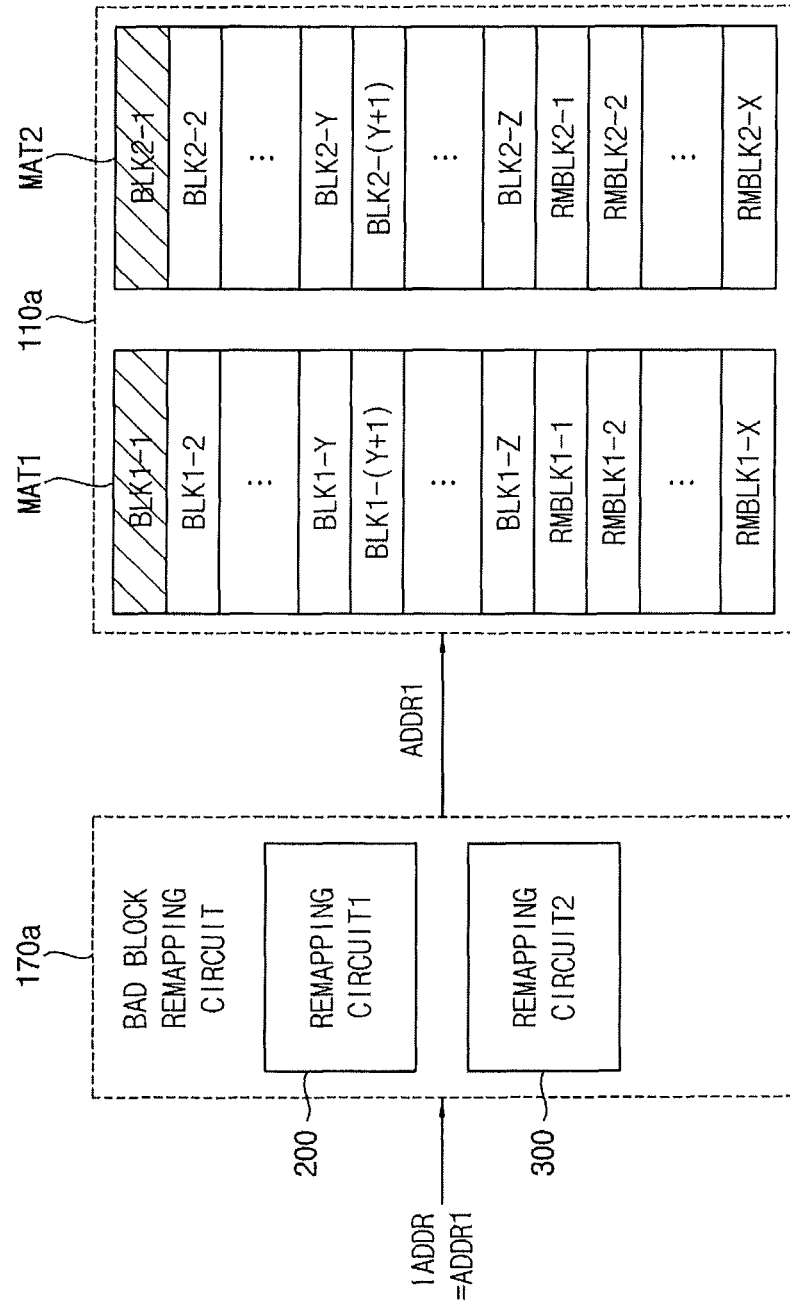

NONVOLATILE MEMORY DEVICE AND MEMORY SYSTEM INCLUDING THE SAME

CROSS-REFERENCE TO RELATED APPLICATION

This application claims priority under 35 USC § 119 to Korean Patent Application No. 10-2017-0034938, filed on Mar. 20, 2017 in the Korean Intellectual Property Office (KIPO), the contents of which are herein incorporated by reference in their entirety.

BACKGROUND

1. Technical Field

Example embodiments relate generally to semiconductor memory devices, and, more particularly, to nonvolatile memory devices and memory systems including the nonvolatile memory devices.

2. Description of the Related Art

Semiconductor memory devices can be grouped into two categories depending upon whether they retain stored data when disconnected from a power supply. These categories include volatile memory devices, which lose stored data when disconnected from power, and nonvolatile memory devices, which retain stored data when disconnected from power.

It is common for nonvolatile memory devices to perform certain operations in units of pages, blocks and/or mats. The page is representative of a smallest unit for a data read operation. The block is representative of a smallest unit for a data erase operation. The mat is representative of a smallest unit for an independent operation such as data program/read/erase operations. It is common for a single block to include a plurality of pages, and for a single mat to include a plurality of blocks.

SUMMARY

At least one example embodiment of the present disclosure provides a nonvolatile memory device capable of reducing a number of bad, or faulty, blocks.

At least one example embodiment of the present disclosure provides a memory system including the nonvolatile memory device.

According to example embodiments, a nonvolatile memory device includes a memory cell array and a bad block remapping circuit. The memory cell array includes a first mat and a second mat that are paired with each other. The first mat includes a plurality of first memory blocks. The second mat includes a plurality of second memory blocks. A first selection memory block among the plurality of first memory blocks and a second selection memory block among the plurality of second memory blocks are accessed based on a first address. The bad block remapping circuit generates a first remapping address based on the first address when it is determined that the first selection memory block is defective. A first remapping memory block among the plurality of first memory blocks and the second selection memory block are accessed based on the first remapping address.

According to example embodiments, a memory system includes a memory controller and a nonvolatile memory device controlled by the memory controller. The nonvolatile memory device includes a memory cell array and a bad block remapping circuit. The memory cell array includes a first mat and a second mat that are paired with each other. The first mat includes a plurality of first memory blocks. The second mat includes a plurality of second memory blocks. A first selection memory block among the plurality of first memory blocks and a second selection memory block among the plurality of second memory blocks are accessed based on a first address. The bad block remapping circuit generates a first remapping address based on the first address when it is determined that the first selection memory block is defective. A first remapping memory block among the plurality of first memory blocks and the second selection memory block are accessed based on the first remapping address.

According to example embodiments, a nonvolatile memory device comprises a memory cell array including a first mat and a second mat that are paired with each other. The first mat includes a plurality of first memory blocks, and the second mat includes a plurality of second memory blocks. An initial one of the first plurality of memory blocks and a corresponding initial one of the second plurality of memory blocks are initially assigned to correspond with each other during normal operation of the nonvolatile memory device as merged blocks accessible based on a first address. A bad block remapping circuit is configured to reassign a selected one of the first memory blocks to correspond with the corresponding initial one of the second memory blocks in response to a determination that the initial one of the first memory blocks is defective. The corresponding selected one of the first memory blocks and the initial one of the second memory blocks are accessible based on the first address.

The nonvolatile memory device according to example embodiments may operate based on a merged block configuration in which two or more mats included in the memory cell array are paired with each other. When one of paired memory blocks is defective, the paired memory blocks are not all handled as bad memory blocks; instead, an address remapping may be performed for replacing only the defective memory blocks with the remapping memory blocks. In addition, in an example where the nonvolatile memory device further includes a priority decoder, the memory block having a runtime error may be replaced with another remapping memory block without duplicated selection. Accordingly, non-defective memory blocks can be preserved and used more efficiently, increasing operability of the resulting device.

BRIEF DESCRIPTION OF THE DRAWINGS

Illustrative, non-limiting example embodiments will be more clearly understood from the following detailed description taken in conjunction with the accompanying drawings.

FIGS. 5A, 5B, 6, 7, 8 and 9 are diagrams for describing an operation of the nonvolatile memory device of FIG. 4, according to example embodiments.

DETAILED DESCRIPTION OF EMBODIMENTS

Figure 1:
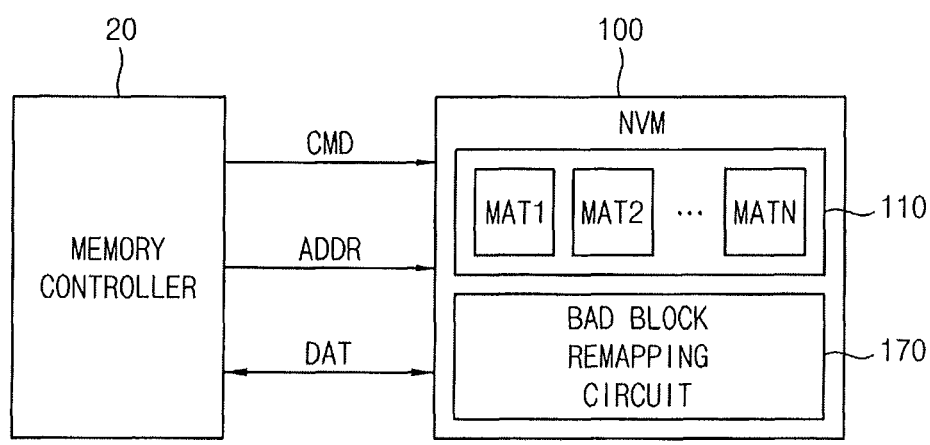
FIG. 1 is a block diagram illustrating a memory system including a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a memory system including a nonvolatile memory device according to example embodiments.

Referring to FIG. 1, a memory system 10 includes a memory controller 20 and a nonvolatile memory device (NVM) 100.

The nonvolatile memory device 100 is controlled and/or accessed by the memory controller 20. For example, in response to requests from an external device (e.g., a host), the memory controller 20 may initiate the storage (e.g., write or program) of data into the nonvolatile memory device 100, may initiate the retrieval (e.g., read or sense) of data from the nonvolatile memory device 100, or may initiate the erasure of data stored in the nonvolatile memory device 100. This listing of services performed by the memory controller is not exhaustive and requests other than those enumerated above may be performed.

In connection with the performance of data services, the memory controller 20 transmits a command CMD and an address ADDR to the nonvolatile memory device 100 via control signal lines, and exchanges data DAT with the nonvolatile memory device 100 via data input/output (I/O) lines. It is common in industry that at least a part or all of the control signal lines and the data I/O lines may be referred to as a channel.

Although not illustrated in FIG. 1, the memory controller 20 may further transmit a control signal to the nonvolatile memory device 100 via the control signal lines, or may further transmit a power supply voltage to the nonvolatile memory device 100 via the power lines. For example, the control signals may include a data strobe signal (DQS), a chip enable signal (/CE), a write enable signal (/WE), a read enable signal (/RE), a command latch enable signal (CLE), an address latch enable signal (ALE), etc. While the control signals referenced above and herein are common in the field, In various embodiments, other control signals may be employed, depending on the application.

In some embodiments, the nonvolatile memory device 100 includes a memory cell array 110 and a bad block remapping circuit 170. The memory cell array 110 includes a plurality of mats. For example, the memory cell array 110 may include first through N-th mats MAT1, MAT2, ..., MATN, where N is a natural number greater than, or equal to, two.

Figure 2:
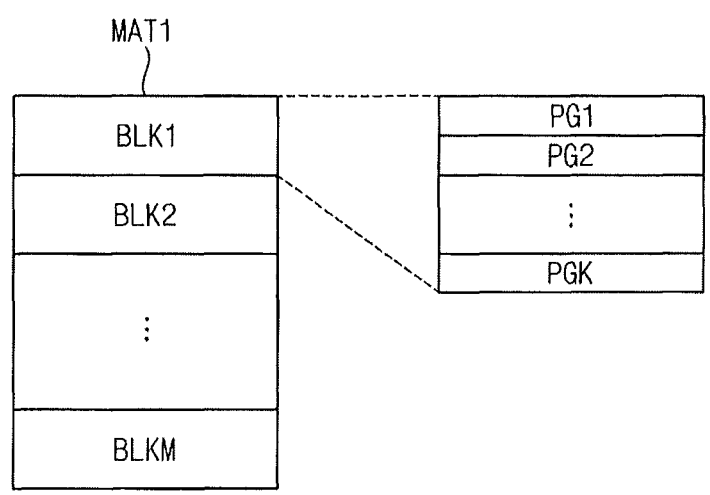
FIG. 2 is a block diagram illustrating an example of a mat included in a nonvolatile memory device according to example embodiments.

FIG. 2 is a block diagram illustrating an example of a mat included in a nonvolatile memory device according to example embodiments.

Referring to FIG. 2, a first mat MAT1 among the plurality of mats may include a plurality of memory blocks (e.g., a plurality of blocks). For example, the first mat MAT1 may include first through M-th memory blocks BLK1, BLK2, ..., BLKM, where M is a natural number greater than or equal to two.

The first memory block BLK1 among the plurality of memory blocks may include a plurality of pages. For example, the first memory block BLK1 of the first mat MAT1 may include first through K-th pages PG1, PG2, ..., PGK, where K is a natural number greater than, or equal to, two.

In some embodiments, the nonvolatile memory device may perform predetermined operations in units of pages, blocks and/or mats. For example, the nonvolatile memory device may perform a data read operation in units of pages, may perform a data erase operation in units of blocks (e.g., memory blocks), and may perform each independent operation, e.g., each of data program/read/erase operations in units of mats. In addition, the nonvolatile memory device may disable a part of a memory cell array in units of blocks when some blocks of the memory cell array are determined to be defective, faulty or otherwise not suitable for use during operation. For purposes of the present disclosure, such faulty blocks are referred to herein as "bad" or "defective" blocks.

Although not illustrated in FIG. 2, as with the first memory block BLK1, each of the second through M-th memory blocks BLK2~BLKM may likewise include a plurality of pages. As with the first mat MAT1, each of the second through N-th mats MAT2~MATN may include a plurality of memory blocks and a plurality of pages. In some embodiments, the number of memory blocks in a single mat may be substantially the same as each other, and the number of pages in a single memory block may be substantially the same as each other. However, in other embodiments, the number of memory blocks in a single mat and the number of pages in a single memory block may vary, depending on the application.

Referring back to FIG. 1, in some embodiments, at least two of the first through N-th mats MAT1~MATN are paired with each other. As used herein, the terms "paired" and/or "pairing" represents that two or more mats are accessed by a single address. For example, if the first and second mats MAT1 and MAT2 are paired with each other, one memory block included in the first mat MAT1 and one memory block included in the second mat MAT2 may be substantially simultaneously or concurrently accessed based on a single address. Such technique may be referred to as a merged block configuration or a merged page configuration.

When it is determined that a memory block corresponding to the address ADDR from the memory controller 20 is defective, the bad block remapping circuit 170 generates a remapping address based on the address ADDR such that a defective memory block or a bad memory block is replaced with a non-defective memory block or a normal memory block. In the merged block configuration, the bad block remapping circuit 170 included in the nonvolatile memory device 10 according to example embodiments may perform an address remapping operation, and then a single defective memory block among the paired memory blocks that are substantially simultaneously accessed by a single address may be replaced with a non-defective single memory block. Accordingly, although one of the memory blocks among paired memory blocks is determined to be defective, a remaining memory block among the paired memory blocks may be deployed and permitted to contribute under normal operation.

Configurations and operations of the bad block remapping circuit 170 in accordance with embodiments of the present inventive concepts are described in further detail herein with reference to FIGS. 4 through 16.

Figure 3:
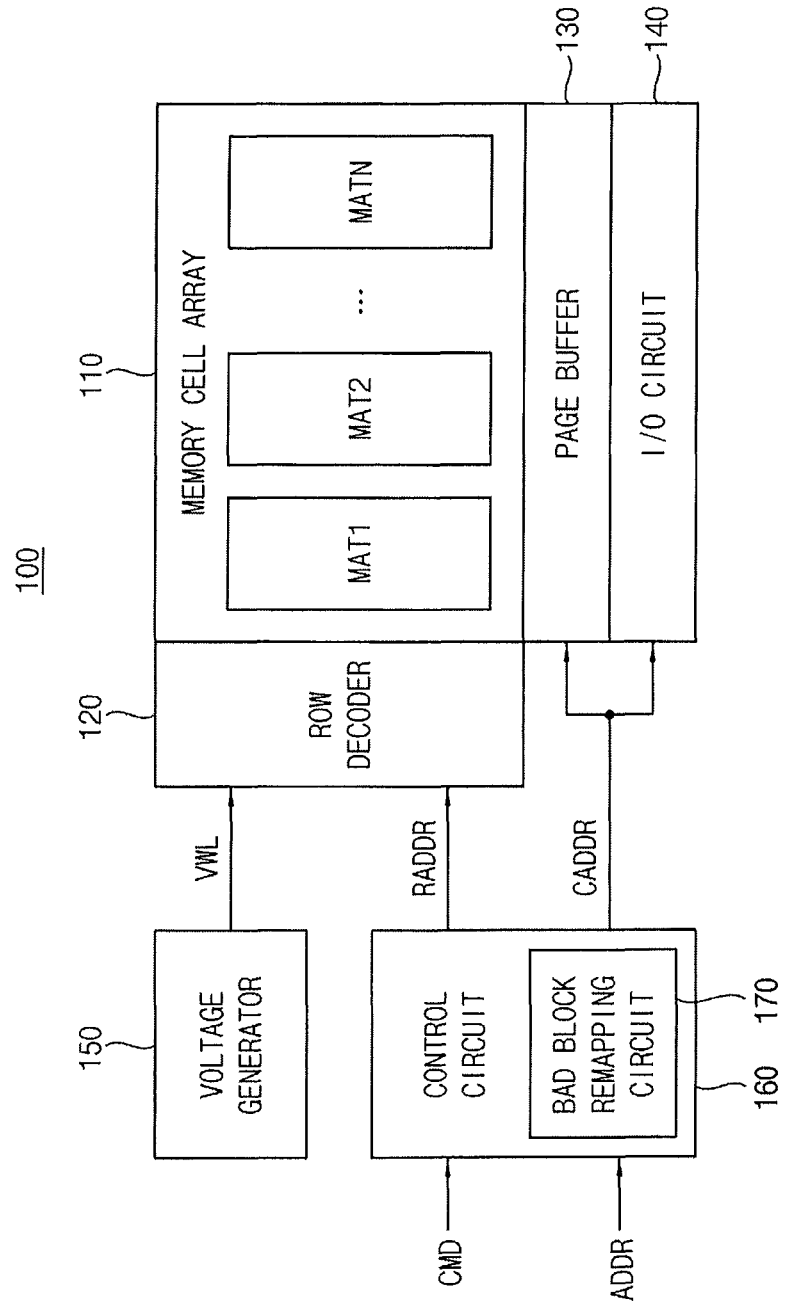
FIG. 3 is a block diagram illustrating a nonvolatile memory device according to example embodiments.

FIG. 3 is a block diagram illustrating a nonvolatile memory device according to example embodiments.

Referring to FIG. 3, in some embodiments, a nonvolatile memory device 100 may include a memory cell array 110, a row decoder 120, a page buffer 130, an I/O circuit 140, a voltage generator 150, a control circuit 160 and a bad block remapping circuit 170.

In some embodiments, the memory cell array 110 may be divided into a plurality of mats MAT1, MAT2, . . . , MATN. As described above with reference to FIG. 2, a mat may represent the smallest unit of accessible memory cells for each independent operation such as data program/read/erase operations. Also, as described herein, each of the plurality of mats MAT1~MATN may include a plurality of memory blocks.

The memory cell array 110 may include a plurality of memory cells. Each of the plurality of memory cells may be connected to a respective one of a plurality of wordlines and a respective one of a plurality of bitlines. For example, the plurality of memory cells may be nonvolatile memory cells. As described herein with reference to FIGS. 17A and 17B, the plurality of memory cells may be arranged in a two dimensional (2-D) array structure or a three dimensional (3-D) vertical array structure.

The row decoder 120 may be connected to the plurality of wordlines. At a time of a memory operation, the row decoder 120 may determine at least one of the plurality of wordlines as a selected wordline and may determine a remainder of the plurality of wordlines other than the selected wordline as unselected wordlines, based on a row address RADDR.

The voltage generator 150 may generate wordline voltages VWL, which are required for an operation of the nonvolatile memory device 100, based on a power supply voltage. The wordline voltages VWL may be applied to the plurality of wordlines via the row decoder 120.

For example, during a data erase operation, the voltage generator 150 may apply an erase voltage to a well of a memory block and may apply a ground voltage to entire wordlines of the memory block. During an erase verification operation, the voltage generator 150 may apply an erase verification voltage to all of the wordlines of the memory block or may sequentially apply the erase verification voltage to sequential wordlines on a wordline basis. In another example, during the data program operation, the voltage generator 150 may apply a program voltage to the selected wordline and may apply a program pass voltage to the unselected wordlines. During a program verification operation, the voltage generator 150 may apply a program verification voltage to the selected wordline and may apply a verification pass voltage to the unselected wordlines. In addition, during the data read operation, the voltage generator 150 may apply a read voltage to the selected wordline and may apply a read pass voltage to the unselected wordlines.

The page buffer 130 may be connected to the plurality of bitlines. The page buffer 130 may store write data to be programmed into the memory cell array 110 or may read data sensed from the memory cell array 110, based on a column address CADDR. In other words, the page buffer 130 may operate as a write driver or a sensing amplifier depending on an operation mode of the nonvolatile memory device 100.

The I/O circuit 140 may provide the write data to the memory cell array 110 via the page buffer 130 or may provide the read data to requesting systems external to the nonvolatile memory device 100 (e.g., to the memory controller 20 in FIG. 1), based on the column address CADDR.

In some example embodiments, the page buffer 130 and the I/O circuit 140 may read data from a first area of the memory cell array 110 and may write the read data to a second area of the memory cell array 110. In other words, in such embodiments, the page buffer 130 and the I/O circuit 140 may perform a copy-back operation.

The control circuit 160 may control the row decoder 120, the page buffer 130, the I/O circuit 140 and the voltage generator 150 based on a command CMD and an address ADDR to perform the data program/read/erase operations for the memory cell array 110. For example, the control circuit 160 may generate control signals for the row decoder 120, the page buffer 130, the I/O circuit 140 and the voltage generator 150 based on the command CMD and may generate the row address RADDR and the column address CADDR based on the address ADDR.

When it is determined that a defective memory block is present in the memory cell array 110, the bad block remapping circuit 170 generates a remapping address based on the address ADDR such that the defective memory block is replaced with a non-defective memory block or a normal memory block. For example, the bad block remapping circuit 170 may perform the address remapping operation for the row address RADDR. In other words, the row address RADDR may be one of an input address provided from the memory controller 20 and a remapping address generated by the address remapping operation.

Although FIG. 3 illustrates an example embodiment where the bad block remapping circuit 170 is located within the control circuit 160, embodiments of the present inventive concepts are not thus limited. For example, in other embodiments, the bad block remapping circuit 170 may be located external to the control circuit 160.

Hereinafter, embodiments of the present inventive concepts will be described in detail based on an example where two mats are paired with each other (e.g., FIGS. 4 through 15) and an example where three mats are paired with each other (e.g., FIG. 16).

Figure 4:
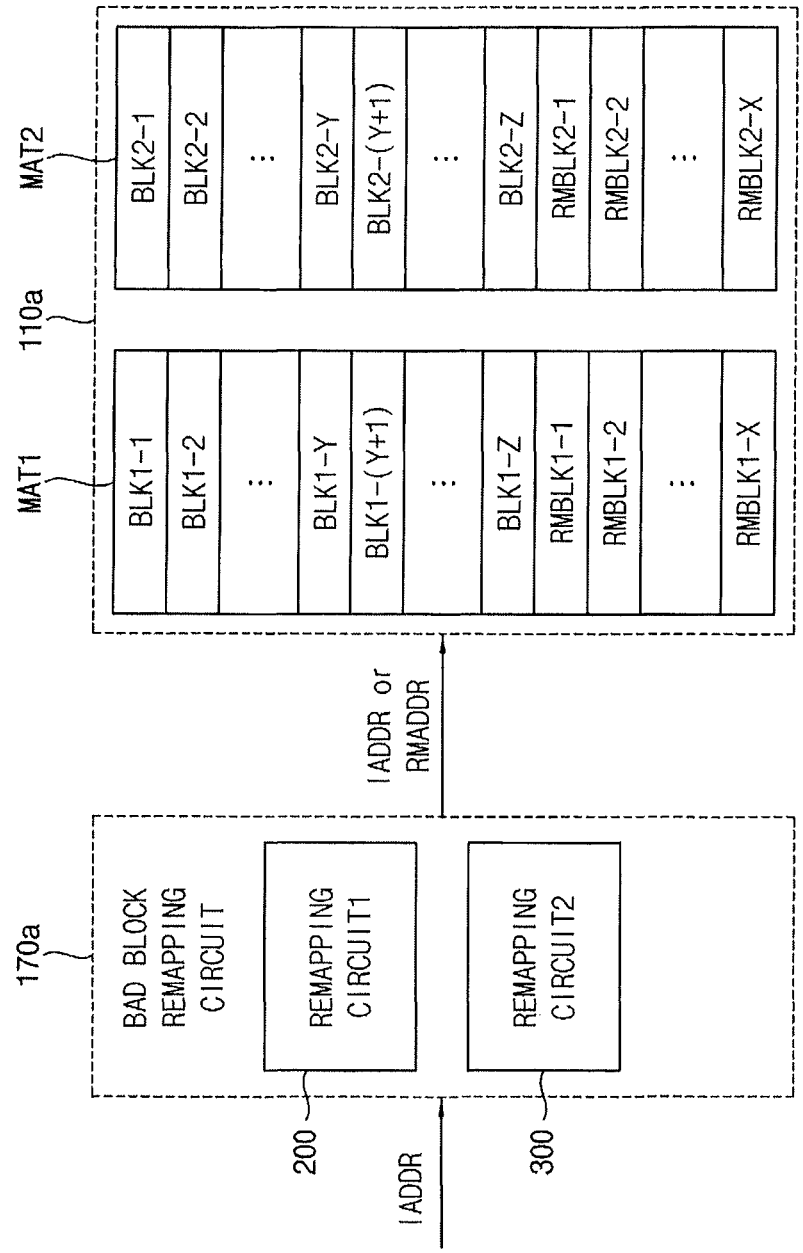
FIG. 4 is a block diagram illustrating an example of a nonvolatile memory device according to example embodiments.

FIG. 4 is a block diagram illustrating an example of a nonvolatile memory device according to example embodiments.

Referring to FIG. 4, a nonvolatile memory device includes a memory cell array 110a and a bad block remapping circuit 170a. For the convenience of illustration, some elements of the nonvolatile memory device other than the memory cell array 110a and the bad block remapping circuit 170a are omitted in FIG. 4.

In the memory cell array 110a of FIG. 4, two mats are paired with each other. For example, the memory cell array 110a includes a first mat MAT1 and a second mat MAT2 that are paired with each other. The first mat MAT1 includes a plurality of first memory blocks BLK1-1, BLK1-2, . . . , BLK1-Y, BLK1-(Y+1), BLK1-Z, RMBLK1-1, RMBLK1-2, . . . , RMBLK1-X, where each of X and Y is a natural number greater than or equal to two and Z is a natural number greater than Y. The second mat MAT2 similarly includes a plurality of second memory blocks BLK2-1, BLK2-2, . . . , BLK2-Y, BLK2-(Y+1), BLK2-Z, RMBLK2-1, RMBLK2-2, . . . , RMBLK2-X.

In some example embodiments, the first mat MAT1 may store least significant bits (LSBs) of data to be stored into the memory cell array 110a, and the second mat MAT2 may store most significant bits (MSBs) of the data to be stored into the memory cell array 110a.

In some example embodiments, all of the plurality of first memory blocks included in the first mat MAT1 may have the same characteristics. As will be described herein, although the memory blocks RMBLK1-1 through RMBLK1-X are used as remapping memory blocks for replacing or repairing defective memory blocks or bad memory blocks, the memory blocks RMBLK1-1 through RMBLK1-X may have characteristics substantially the same as those of the memory blocks BLK1-1 through BLK1-Z. In other words, the memory blocks RMBLK1-1 through RMBLK1-X and the memory blocks BLK1-1 through BLK1-Z may be all of the same type, and thus one of the plurality of first memory blocks can be accessed based on any address. Similarly, all of the plurality of second memory blocks included in the second mat MAT2 may have the same characteristics.

In the present example embodiment, it is assumed that one of the plurality of first memory blocks and one of the plurality of second memory blocks can be substantially simultaneously accessed based on one of an input address IADDR and a remapping address RMADDR that are provided from the bad block remapping circuit 170a.

The bad block remapping circuit 170a selectively converts the input address IADDR that is received from an external memory controller (e.g., the memory controller 20 in FIG. 1) into the remapping address RMADDR. For example, when it is determined that one of the plurality of first memory blocks or one of the plurality of second memory blocks corresponding to the input address IADDR is defective (e.g., the defective memory block or the bad memory block), the bad block remapping circuit 170a generates the remapping address RMADDR based on the input address IADDR. When it is determined that one of the plurality of first memory blocks and one of the plurality of second memory blocks corresponding to the input address IADDR are not defective, the bad block remapping circuit 170a outputs the input address IADDR without the remapping operation.

In some embodiments, the bad block remapping circuit 170a may include a first remapping circuit 200 and a second remapping circuit 300. In some embodiments, the first remapping circuit 200 may store bad block information and remapping information for the plurality of first memory blocks included in the first mat MAT1. Similarly, in some embodiments, the second remapping circuit 300 may store bad block information and remapping information for the plurality of second memory blocks included in the second mat MAT2.

Figure 5B:
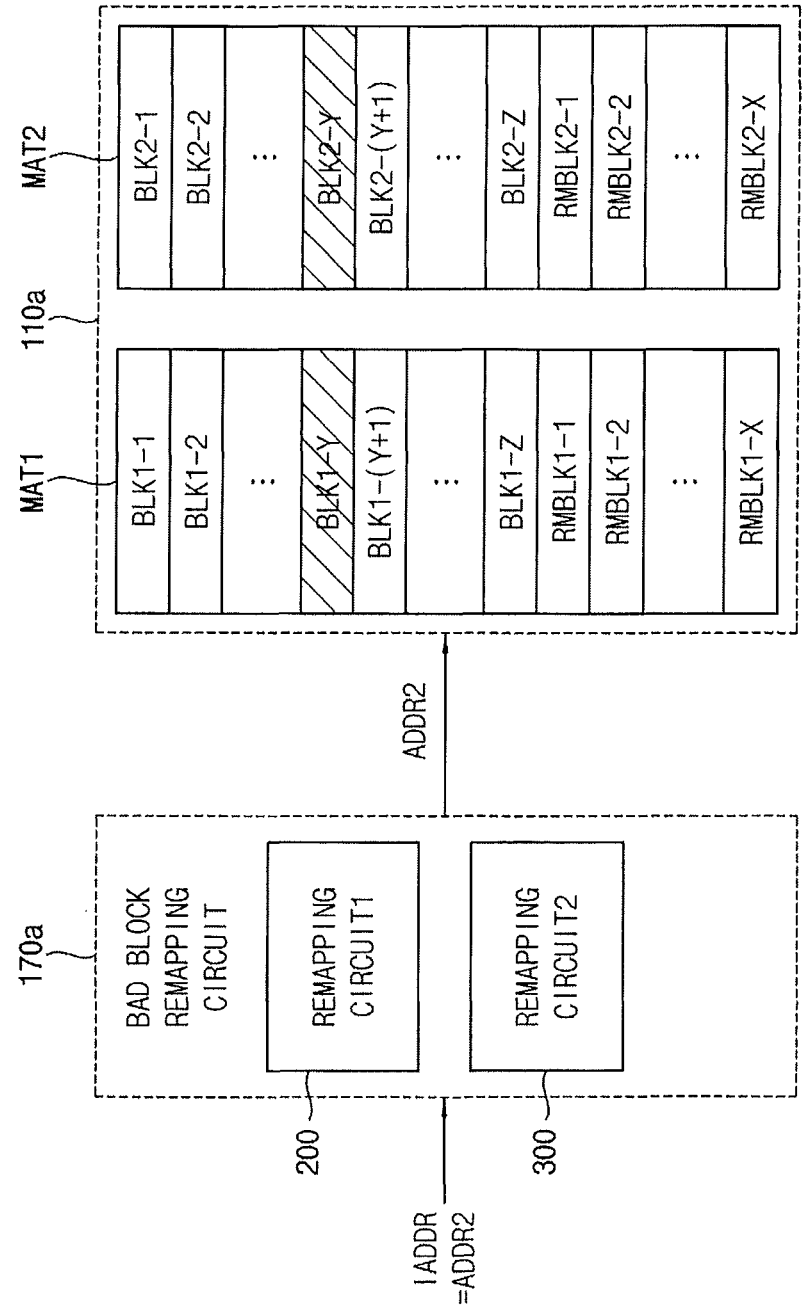
Figure 6:
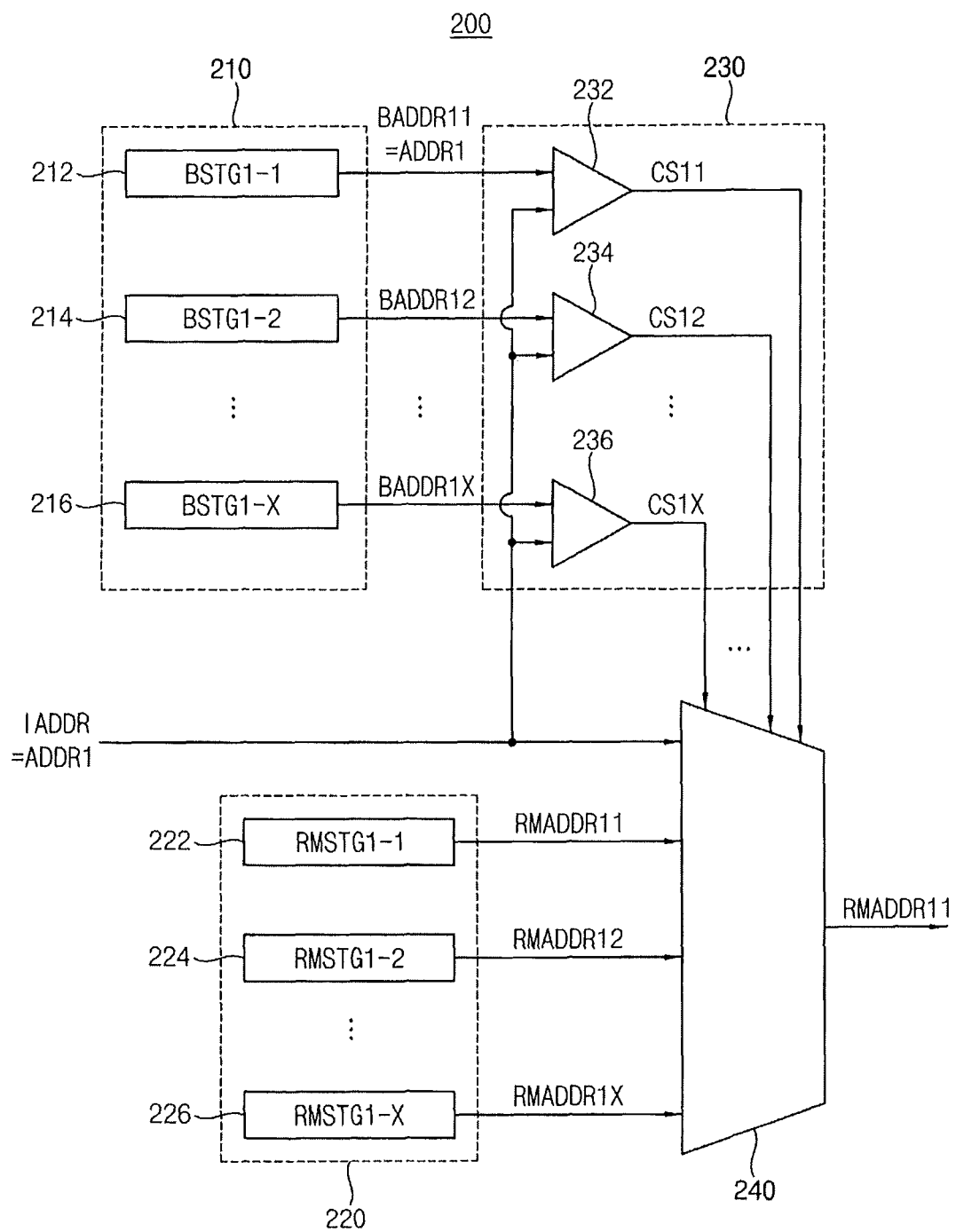
Figure 7:
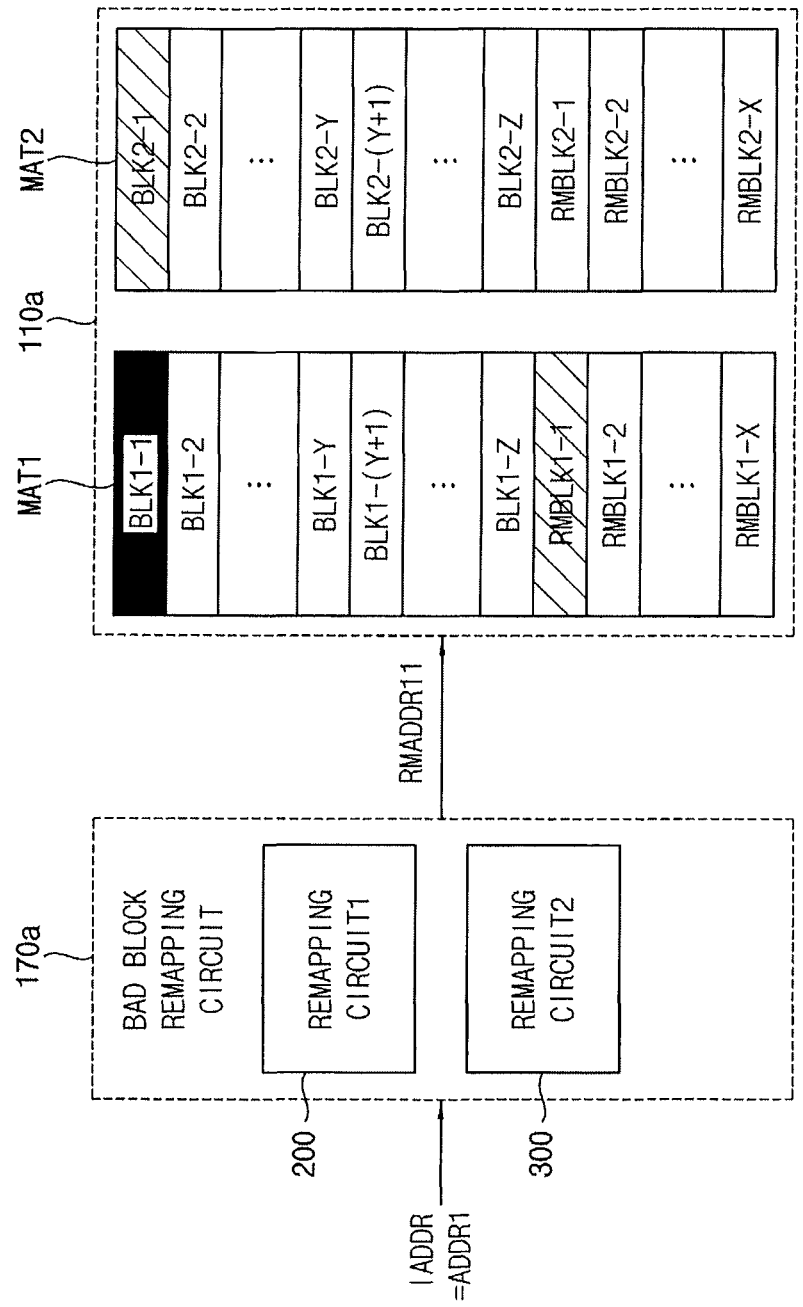
Figure 8:
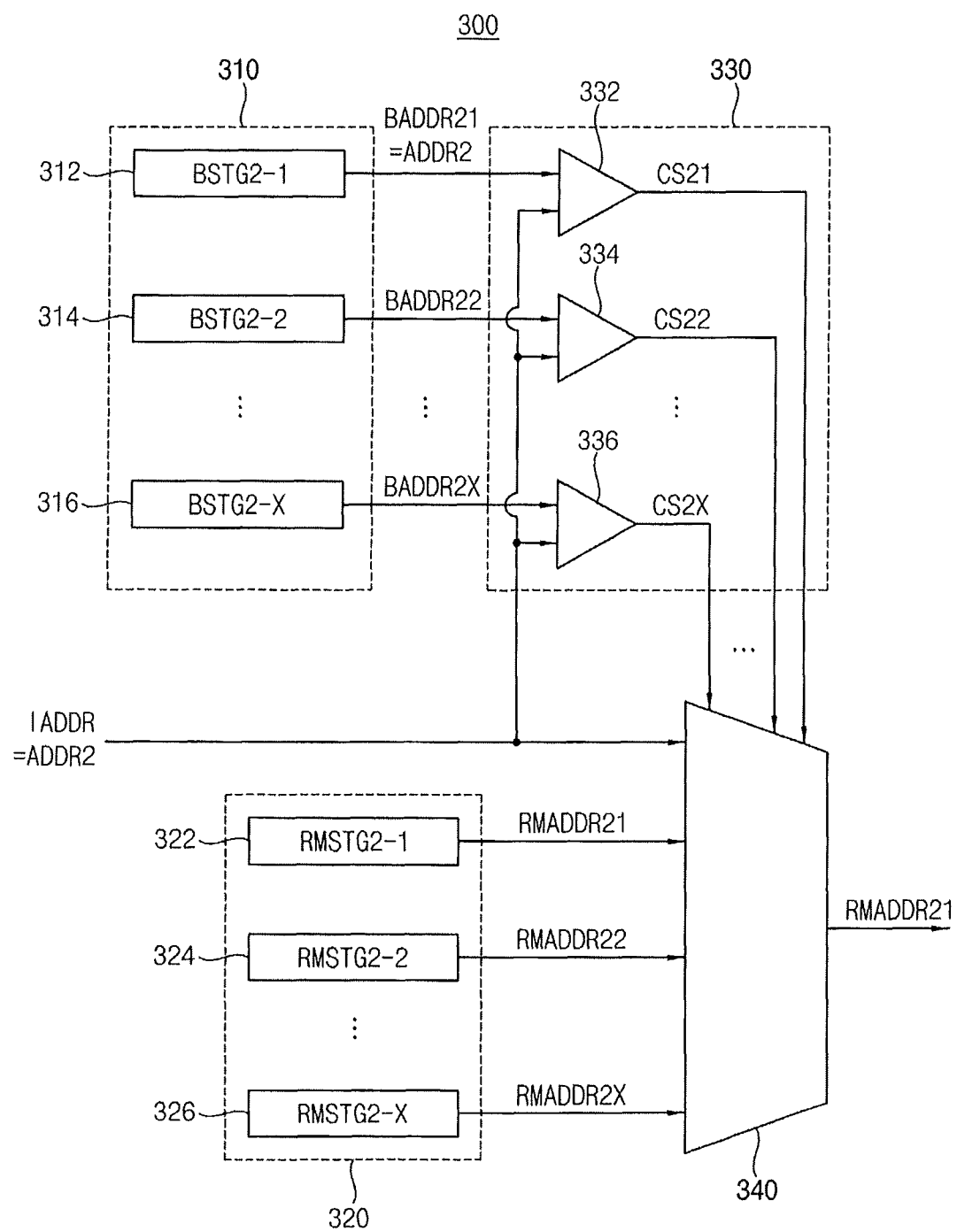
Figure 9:
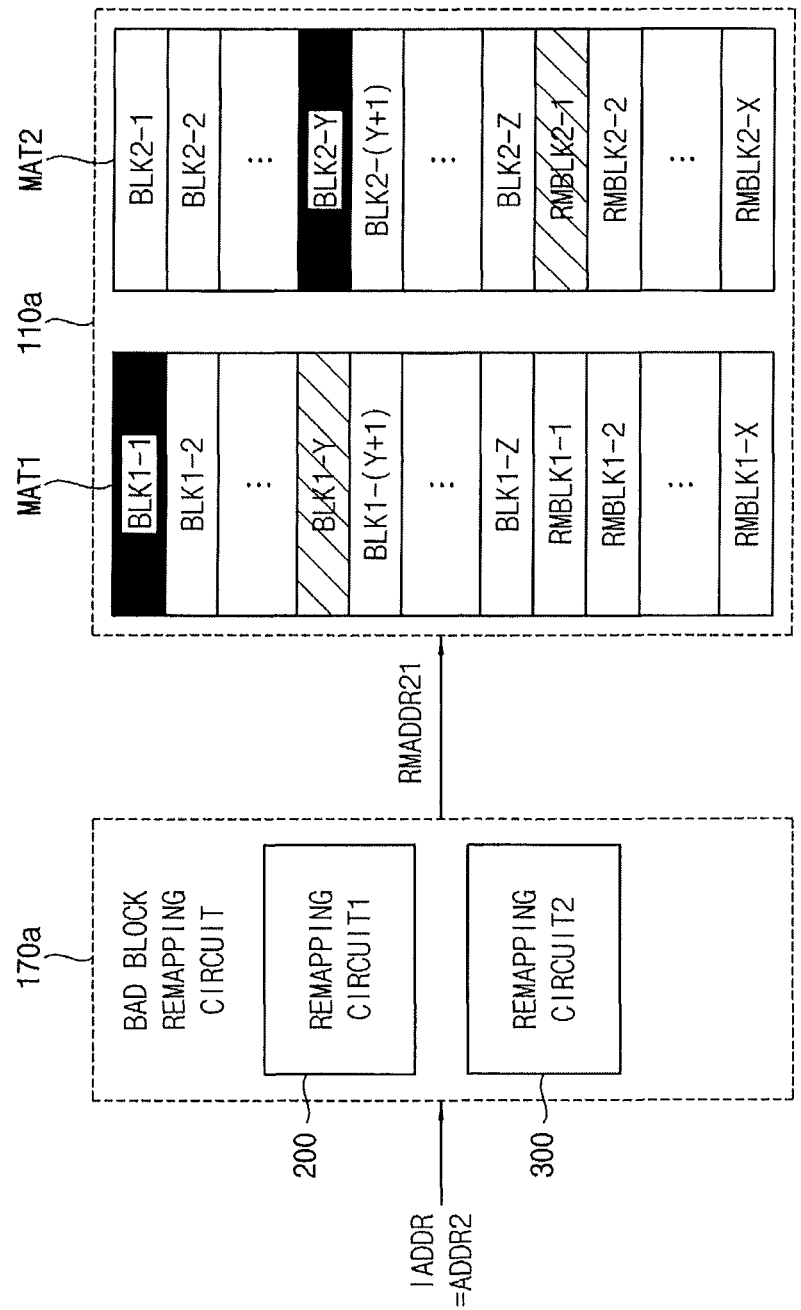

FIGS. 5A, 5B, 6, 7, 8 and 9 are diagrams for describing an operation of the nonvolatile memory device of FIG. 4, in accordance with embodiments of the present inventive concepts. FIGS. 5A and 5B illustrate examples where both the first mat MAT1 and the second mat MAT2 do not include defective memory blocks or bad memory blocks. FIGS. 6 and 7 illustrate an example where the first mat MAT1 includes one defective memory block. FIGS. 8 and 9 illustrate an example where each of the first mat MAT1 and the second mat MAT2 includes one defective memory block.

Referring to FIGS. 5A and 5B, when both the first mat MAT1 and the second mat MAT2 do not include defective memory blocks or bad memory blocks, the bad block remapping circuit 170a may output the input address IADDR itself without requiring the remapping operation.

For example, as illustrated in FIG. 5A, a first selection memory block BLK1-1 in the first mat MAT1 and a second selection memory block BLK2-1 in the second mat MAT2 may correspond to a first address ADDR1, and both the first selection memory block BLK1-1 and the second selection memory block BLK2-1 may be non-defective memory blocks or normal memory blocks. When the first address ADDR1 is provided as the input address IADDR, the bad block remapping circuit 170a may output the first address ADDR1 without applying the remapping operation. The first selection memory block BLK1-1 and the second selection memory block BLK2-1 (e.g., hatched blocks in FIG. 5A) may be substantially simultaneously accessed based on the first address ADDR1.

In another example, as illustrated in FIG. 5B, a third selection memory block BLK1-Y in the first mat MAT1 and a fourth selection memory block BLK2-Y in the second mat MAT2 may correspond to a second address ADDR2 different from the first address ADDR1, and both the third selection memory block BLK1-Y and the fourth selection memory block BLK2-Y may be non-defective memory blocks or normal memory blocks. When the second address ADDR2 is provided as the input address IADDR, the bad block remapping circuit 170a may output the second address ADDR2 without applying the remapping operation. The third selection memory block BLK1-Y and the fourth selection memory block BLK2-Y (e.g., hatched blocks in FIG. 5B) may be substantially simultaneously accessed based on the second address ADDR2.

Referring to FIGS. 6 and 7, when the first mat MAT1 includes one defective memory block, the bad block remapping circuit 170a may generate a remapping address based on the input address IADDR to output the remapping address.

For example, as illustrated in FIG. 7, when it is determined that the first selection memory block BLK1-1 (e.g., black block in FIG. 7) in the first mat MAT1 is defective, the bad block remapping circuit 170a may store the first address ADDR1 corresponding to the first selection memory block BLK1-1 as the bad block information. After then, when the first address ADDR1 is received as the input address IADDR, the bad block remapping circuit 170a may check that the first address ADDR1 is included in the bad block information and may generate a remapping address RMADDR11 based on the first address ADDR1. Thus, a remapping memory block RMBLK1-1 and the second selection memory block BLK2-1 (e.g., hatched blocks in FIG. 7) may be substantially simultaneously accessed based on the remapping address RMADDR11. In some example embodiments, following the remapping operation, the remapping memory block RMBLK1-1 can no longer be accessed based on an initial address, but rather, only through the remapping process. In this manner, the remapping memory block RMBLK1-1 is reserved for operation only through the remapping process.

Such remapping operation described with reference to FIG. 7 may be performed by the first remapping circuit 200 included in the bad block remapping circuit 170a. In other words, the first remapping circuit 200 may replace the input address IADDR with the remapping address RMADDR11 when the input address IADDR is substantially the same as the first address ADDR1.

For example, as illustrated in the embodiment of FIG. 6, the first remapping circuit 200 may include a first storage unit 210, a second storage unit 220, a comparing unit 230 and an output unit 240. The bad block information and the remapping information for the first mat MAT1 may be stored in the first remapping circuit 200.

The first storage unit 210 may store the bad block information for the first mat MAT1. For example, the first storage unit 210 may store bad addresses BADDR11, BADDR12, . . . , BADDR1X that represent addresses corresponding to defective memory blocks or bad memory blocks in the first mat MAT1. The first storage unit 210 may include a plurality of bad address storage units 212, 214 and 216. The bad address storage unit (BSTG1-1) 212 may store the bad address BADDR11, the bad address storage unit (BSTG1-2) 214 may store the bad address BADDR12, and the bad address storage unit (BSTG1-X) 216 may store the bad address BADDR1X.

When the first mat MAT1 includes only one defective memory block (e.g., the memory block BLK1-1), the bad address storage unit 212 may store the first address ADDR1 corresponding to the first selection memory block BLK1-1 as the bad address BADDR11, and the bad address storage units 214 and 216 other than the bad address storage unit 212 may remain empty.

In some example embodiments, each of the bad address storage units 212, 214 and 216 may include a register that stores a single bad address.

The second storage unit 220 may store the remapping information for the first mat MAT1. For example, the second storage unit 220 may store remapping addresses RMADDR11, RMADDR12, . . . , RMADDR1X that represent addresses corresponding to remapping memory blocks in the first mat MAT1 for replacing the defective memory blocks in the first mat MAT1. The second storage unit 220 may include a plurality of remapping address storage units 222, 224 and 226. The remapping address storage unit (RMSTG1-1) 222 may store the remapping address RMADDR11, the remapping address storage unit (RMSTG1-2) 224 may store the remapping address RMADDR12, and the remapping address storage unit (RMSTG1-X) 226 may store the remapping address RMADDR1X.

The remapping address RMADDR11 may correspond to the remapping memory block RMBLK1-1 in the first mat MAT1, the remapping address RMADDR12 may correspond to the remapping memory block RMBLK1-2 in the first mat MAT1, and the remapping address RMADDR1X may correspond to the remapping memory block RMBLK1-X in the first mat MAT1. All of the remapping address storage units 222, 224 and 226 in the second storage unit 220 may store the remapping addresses RMADDR11~RMADDR1X, respectively; accordingly, in some embodiments, none of the remapping address storage units are empty.

In some example embodiments, each of the remapping address storage units 222, 224 and 226 may include a plurality of fuses, each of which stores a respective one bit of a single remapping address. For example, in some embodiments, each of the fuses may be an electrical fuse or an e-fuse.

The comparing unit 230 may compare the input address IADDR with the bad addresses BADDR11~BADDR1X. In some embodiments, the comparing unit 230 may include a plurality of comparators 232, 234 and 236. The comparator 232 may compare the input address IADDR with the bad address BADDR11 and may generate a comparison signal CS11 that represents the comparison result. The comparator 234 may compare the input address IADDR with the bad address BADDR12 and may generate a comparison signal CS12 that represents the comparison result. The comparator 236 may compare the input address IADDR with the bad address BADDR1X and may generate a comparison signal CS1X that represents the comparison result.

In a case where the input address IADDR is substantially the same as a respective one of the bad addresses BADDR11~BADDR1X (e.g., if the input address IADDR results in a "hit"), a respective one of the comparison signals CS11~CS1X may have a first logic level (e.g., a logic high level). In a case where the input address IADDR is different than a respective one of the bad addresses BADDR11~BADDR1X, a respective one of the comparison signals CS11~CS1X may have a second logic level (e.g., a logic low level). For example, when the first address ADDR1 is received as the input address IADDR, and thus the input address IADDR is substantially the same as the bad address BADDR11, the comparison signal CS11 may have the first logic level, and the comparison signals CS12~CS1X other than the comparison signal CS11 may have the second logic level.

The output unit 240 may output the input address IADDR or may output one of the remapping addresses RMADDR11~RMADDR1X based on the comparison results from the comparing unit 230.

For example, when the first address ADDR1 is received as the input address IADDR, and thus the input address IADDR is substantially the same as the bad address BADDR11, the comparison signal CS11 may have the first logic level, and the output unit 240 may output the remapping address RMADDR11 (not the input address IADDR) based on the comparison signal CS11.

In the nonvolatile memory device according to example embodiments that operates based on the merged block configuration, any of the defective memory blocks BLK1-1, and any of the memory blocks BLK2-1 that is paired with a defective memory block BLK1-1, is not managed as a pair of bad memory blocks. Instead, an address remapping operation may be performed such that only the defective memory block BLK1-1 is replaced with the remapping memory block RMBLK1-1. Accordingly, the remapping memory block RMBLK1-1 and the memory block BLK2-1 may be substantially simultaneously accessed based on the single remapping address RMADDR11. Accordingly, the non-defective memory block BLK2-1 may be advantageously retained for use, and the number of valid memory blocks available for operation may be thereby increased.

Although FIGS. 6 and 7 illustrate an example where the first mat MAT1 includes only one defective memory block, embodiments of the present inventive concepts may be adopted to an example where the first mat MAT1 includes two or more defective memory blocks. For example, in a case where it is determined that the memory block BLK1-2 in the first mat MAT1 is additionally defective, an address corresponding to the memory block BLK1-2 may be stored in the bad address storage 214. When the address corresponding to the memory block BLK1-2 is received as the input address IADDR, the input address IADDR may be replaced with the remapping address RMADDR12, and thus the memory block BLK1-2 may be replaced with the remapping memory block RMBLK1-2.

In some example embodiments, if the number of the defective memory blocks in the first mat MAT1 is greater than the number (e.g., X) of the remapping memory blocks RMBLK1-1 through RMADDR1X, an (X+1)-th detected defective memory block can not be replaced with the remapping memory block and may be handled or arranged as a bad memory block.

Although not illustrated in FIGS. 6 and 7, if the input address IADDR is different from all of the bad addresses BADDR11~BADDR1X (e.g., if the input address IADDR does not result in a "hit"), the first remapping circuit 200 may output the input address IADDR itself without the remapping operation. For example, when an address other than the first address ADDR1 is received as the input address IADDR in an example of FIG. 6, the input address IADDR may be output without the remapping operation. In another example, when the first selection memory block BLK1-1 is a non-defective memory block, and when the first address ADDR1 is received as the input address IADDR in an example of FIG. 5A, the input address IADDR may be output without the remapping operation.

Referring to FIGS. 8 and 9, when both of the first mat MAT1 and the second mat MAT2 include one defective memory block, the bad block remapping circuit 170a may generate a remapping address based on the input address IADDR to output the remapping address.

For example, as illustrated in FIG. 9, when it is determined that the first selection memory block BLK1-1 (e.g., black block in FIG. 9) in the first mat MAT1 and the fourth selection memory block BLK2-Y (e.g., black block in FIG. 9) in the second mat MAT2 are defective, the bad block remapping circuit 170a may store the first address ADDR1 corresponding to the first selection memory block BLK1-1 and a second address ADDR2 corresponding to the fourth selection memory block BLK2-Y as the bad block information. in some embodiments, the first selection memory block BLK1-1 and the fourth selection memory block BLK2-Y may be arranged at different locations (e.g., in different rows). After then, when the second address ADDR2 is received as the input address IADDR, the bad block remapping circuit 170a may check that the second address ADDR2 is included in the bad block information and may generate a remapping address RMADDR21 based on the second address ADDR2. Accordingly, the third selection memory block BLK1-Y and a remapping memory block RMBLK2-1 (e.g., hatched blocks in FIG. 9) may be substantially simultaneously accessed based on the remapping address RMADDR21. When the first address ADDR1 is received as the input address IADDR, an operation of the nonvolatile memory device may be substantially the same as the operation described with reference to FIGS. 6 and 7. In some example embodiments, after the remapping operation, the remapping memory blocks RMBLK1-1 and RMBLK2-1 are no longer accessible during operation based on their initial addresses.

Such a remapping operation described with reference to FIG. 9 may be performed by the second remapping circuit 300 included in the bad block remapping circuit 170a. In other words, the second remapping circuit 300 may replace the input address IADDR with the remapping address RMADDR21 when the input address IADDR is substantially the same as the second address ADDR2.

For example, the second remapping circuit 300 may have a configuration substantially the same as that of the first remapping circuit 200 of FIG. 6. As illustrated in FIG. 8, the second remapping circuit 300 may include a first storage unit 310, a second storage unit 320, a comparing unit 330 and an output unit 340. The bad block information and the remapping information for the second mat MAT2 may be stored in the second remapping circuit 300.

The first storage unit 310 may store the bad block information for the second mat MAT2. For example, the first storage unit 310 may store bad addresses BADDR21, BADDR22, ..., BADDR2X that represent addresses corresponding to defective memory blocks or bad memory blocks in the second mat MAT2. The first storage unit 310 may include a plurality of bad address storage units (BSTG2-1, BSTG2-2, ..., BSTG2-X) 312, 314 and 316 that store the bad addresses BADDR21~BADDR2X, respectively. When the second mat MAT2 includes only one defective memory block (e.g., the memory block BLK2-Y), the bad address storage unit 312 may store the second address ADDR2 corresponding to the fourth selection memory block BLK2-Y as the bad address BADDR21, and the bad address storage units 314 and 316 other than the bad address storage unit 312 may remain empty.

The second storage unit 320 may store the remapping information for the second mat MAT2. For example, the second storage unit 320 may store remapping addresses RMADDR21, RMADDR22, ..., RMADDR2X that represent addresses corresponding to remapping memory blocks in the second mat MAT2 for replacing the defective memory blocks in the second mat MAT2. The second storage unit 320 may include a plurality of remapping address storage units (RMSTG2-1, RMSTG2-2, ..., RMSTG2-X) 322, 324 and 326 that store the remapping addresses RMADDR21~RMADDR2X, respectively. The remapping addresses RMADDR21~RMADDR2X may correspond to the remapping memory block RMBLK2-1 through RMBLK2-X in the second mat MAT2, respectively. All of the remapping address storage units 322, 324 and 326 may store the remapping addresses RMADDR21~RMADDR2X, respectively, and accordingly, in some embodiments, none of the remapping address storage units are empty.

The comparing unit 330 may compare the input address IADDR with the bad addresses BADDR21~BADDR2X. In some embodiments, the comparing unit 330 may include a plurality of comparators 332, 334 and 336. Each of the comparators 332, 334 and 336 may compare the input address IADDR with a respective one of the bad addresses BADDR21~BADDR2X and may generate a respective one of comparison signals CS21, CS22, ..., CS2X that represents the comparison result. The output unit 340 may output the input address IADDR or may output one of the remapping addresses RMADDR21~RMADDR2X based on the comparison results from the comparing unit 330.

For example, in a case where the second address ADDR2 is received as the input address IADDR, and thus the input address IADDR is substantially the same as the bad address BADDR21, the comparing unit 330 may generate the comparison signal CS21 having the first logic level, and the output unit 340 may output the remapping address RMADDR21 (not the input address IADDR) based on the comparison signal CS21.

In the nonvolatile memory device according to example embodiments that operates based on the merged block configuration, any of the defective memory blocks BLK1-1 and BLK2-Y and the memory blocks BLK2-1 and BLK1-Y paired with the defective memory blocks BLK1-1 and BLK2-Y are not managed as pairs of bad memory blocks. Instead, an address remapping operation may be performed such that only the defective memory blocks BLK1-1 and BLK2-Y are replaced with the remapping memory blocks RMBLK1-1 and RMBLK2-1. Accordingly, the remapping memory block RMBLK1-1 and the memory block BLK2-1 may be substantially simultaneously accessed based on the remapping address RMADDR11, and the memory block BLK1-Y and the remapping memory block RMBLK2-1 may be substantially simultaneously accessed based on the single remapping address RMADDR21. Accordingly, the non-defective memory blocks BLK2-1 and BLK1-Y may be advantageously retained for use, and the number of valid memory blocks available for operation may be thereby increased. In addition, the defective memory blocks BLK1-1 and BLK2-Y located in different mats may be arranged as a pair of bad memory blocks. In other words, unpaired defective memory blocks BLK1-1 and BLK2-Y that are arranged at different rows may be arranged as a pair of bad memory blocks.

Although FIGS. 8 and 9 illustrate an example where each of the first mat MAT1 and the second mat MAT2 includes only one defective memory block, embodiments of the present inventive concepts may be adopted to an example where each of the first mat MAT1 and the second mat MAT2 includes two or more defective memory blocks.

Although not illustrated in FIGS. 6 through 9, when the second mat MAT2 includes at least one defective memory block, an operation of the nonvolatile memory device may be similar to the operation described with reference to FIGS. 6 and 7.

In some example embodiments, the defective memory block BLK1-1 in FIG. 7 and/or the defective memory blocks BLK1-1 and BLK2-Y in FIG. 9 may be an initial bad memory block in which a defect occurs during a manufacturing process of the nonvolatile memory device. In other example embodiments, the defective memory block BLK1-1 in FIG. 7 and/or the defective memory blocks BLK1-1 and BLK2-Y in FIG. 9 may be a runtime bad memory block in which a defect occurs following a manufacturing process of the nonvolatile memory device and during usage of the nonvolatile memory device (e.g., during usage by a user).

Figure 10:
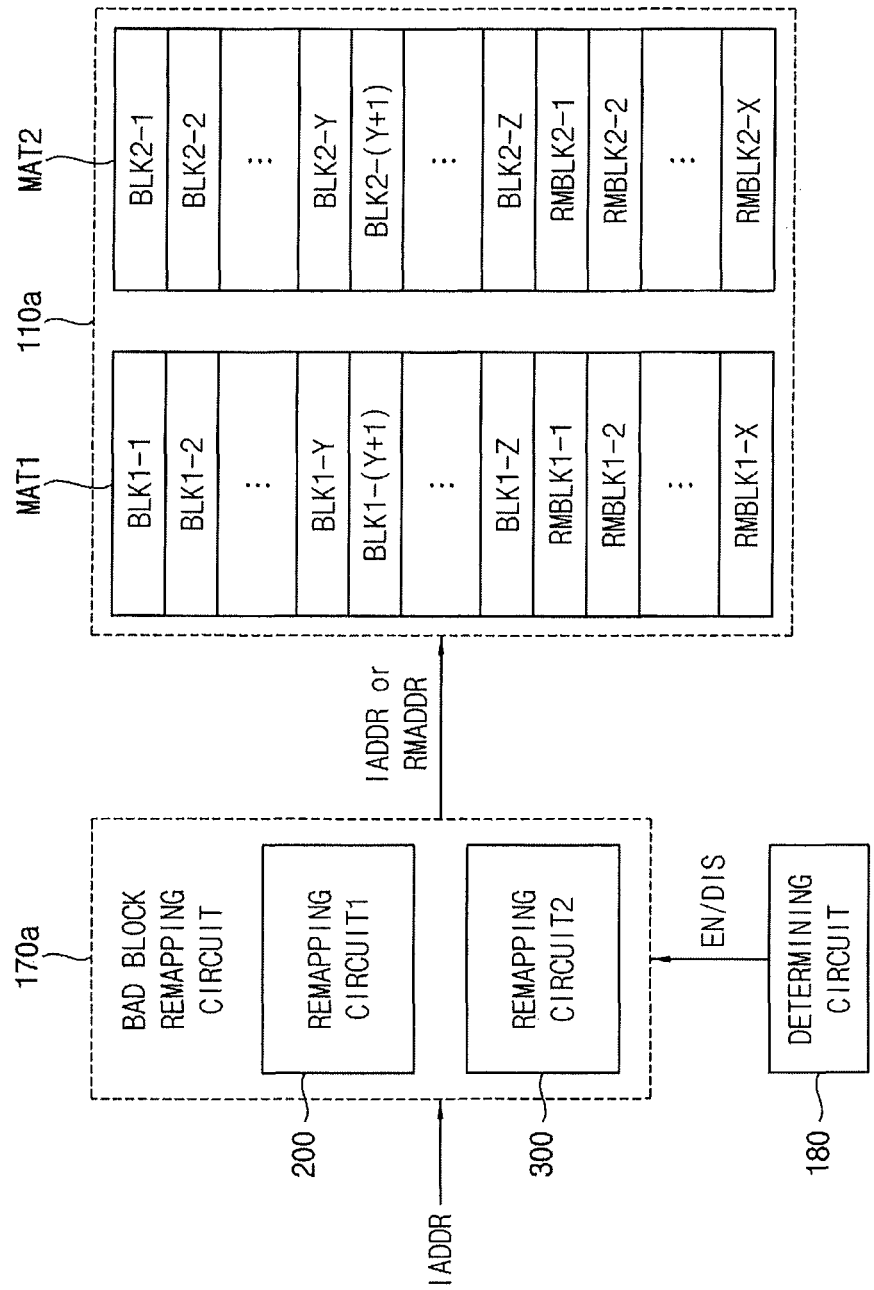
FIGS. 10, 11 and 12 are block diagrams illustrating other examples of a nonvolatile memory device according to example embodiments.
Figure 11:
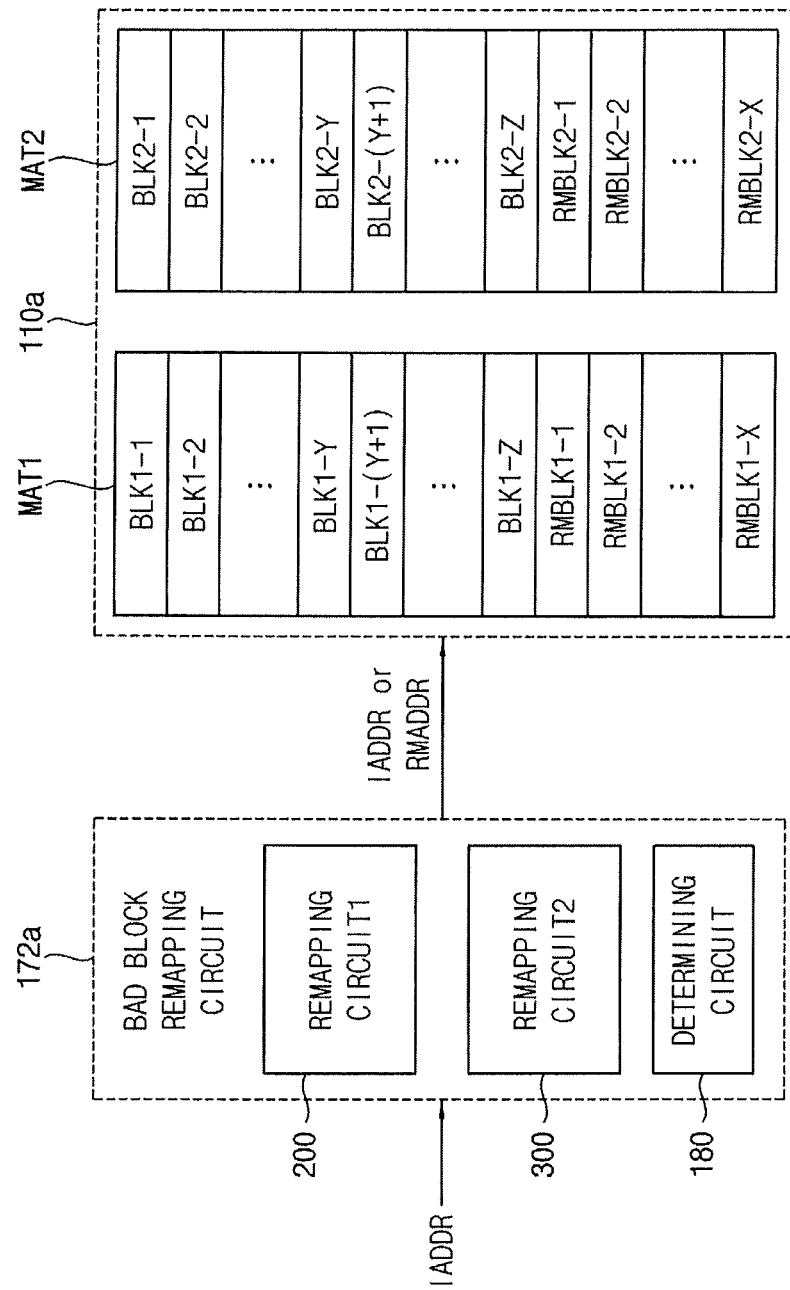
Figure 12:
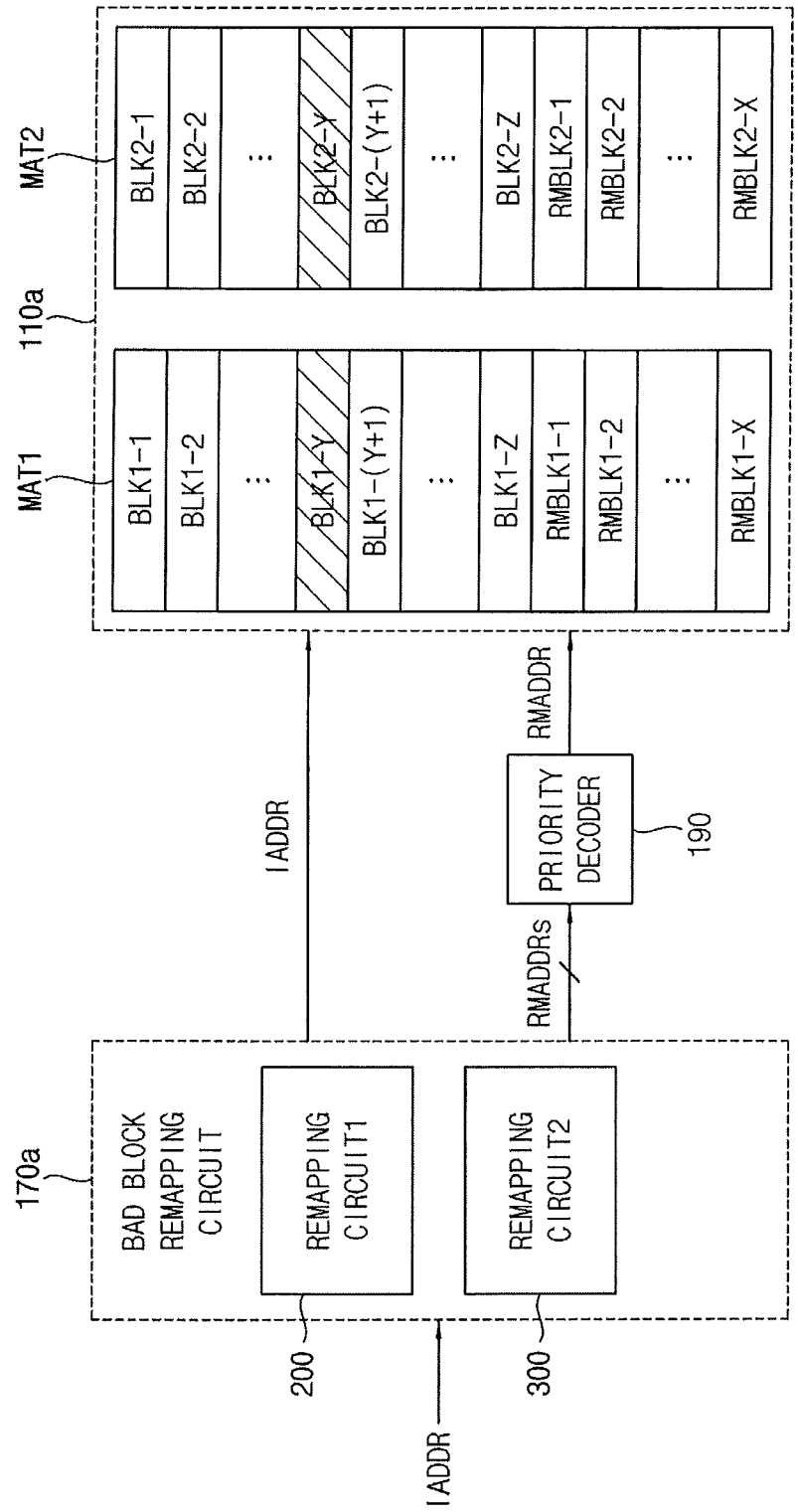

FIGS. 10, 11 and 12 are block diagrams illustrating other examples of a nonvolatile memory device according to example embodiments of the present inventive concepts.

Referring to FIG. 10, a nonvolatile memory device includes a memory cell array 110a and a bad block remapping circuit 170a. In the present embodiment, the nonvolatile memory device may further include a determining circuit 180.

The nonvolatile memory device of the embodiment of FIG. 10 may be substantially the same as the nonvolatile memory device of FIG. 4, except that the nonvolatile memory device of FIG. 10 further includes the determining circuit 180.

The determining circuit 180 may operate to determine whether the bad block remapping circuit 170a is enabled or disabled. For example, as illustrated in FIGS. 7 and 9, when it is determined that at least one defective memory block exists in the memory cell array 110a and thus the remapping operation is required, the determining circuit 180 may generate an activation signal EN for enable the bad block remapping circuit 170a. As illustrated in FIGS. 5A and 5B, when it is determined that the memory cell array 110a does not include any defective memory block and thus the remapping operation is not required, the determining circuit 180 may generate a deactivation signal DIS for disabling the bad block remapping circuit 170a. In some embodiments, the determining circuit 180 may generate the activation signal EN or the deactivation signal DIS based on a signal set by a user (not illustrated).

In some example embodiments, the determining circuit 180 may include a fuse that stores information as to whether the bad block remapping circuit 170a is enabled or disabled. For example, the fuse may be an electrical fuse or an e-fuse.

Referring to FIG. 11, a nonvolatile memory device includes a memory cell array 110a and a bad block remapping circuit 172a.

The nonvolatile memory device of the embodiments of FIG. 11 may be substantially the same as the nonvolatile memory device of other embodiments FIG. 10, except that, in the embodiment of FIG. 11, the determining circuit 180 is located within, proximal to, or integral with, the bad block remapping circuit 172a.

Referring to the embodiment of FIG. 12, a nonvolatile memory device includes a memory cell array 110a and a bad block remapping circuit 170a. In the present embodiment, the nonvolatile memory device may further include a priority decoder 190.

The nonvolatile memory device of FIG. 12 may be substantially the same as the nonvolatile memory device of FIG. 4, except that the nonvolatile memory device of FIG. 12 further includes the priority decoder 190.

In some example embodiments, the bad block remapping circuit 170a may substantially simultaneously generate two or more remapping addresses RMADDRs based on the input address IADDR. The priority decoder 190 may select one of the remapping addresses RMADDRs from the bad block remapping circuit 170a to output the selected remapping address RMADDR having higher priority.

In some example embodiments, when the input address IADDR is output from the bad block remapping circuit 170a without the remapping operation, the input address IADDR may not be provided to the priority decoder 190 and may be directly provided directly to the memory cell array 110a.

Figure 13:
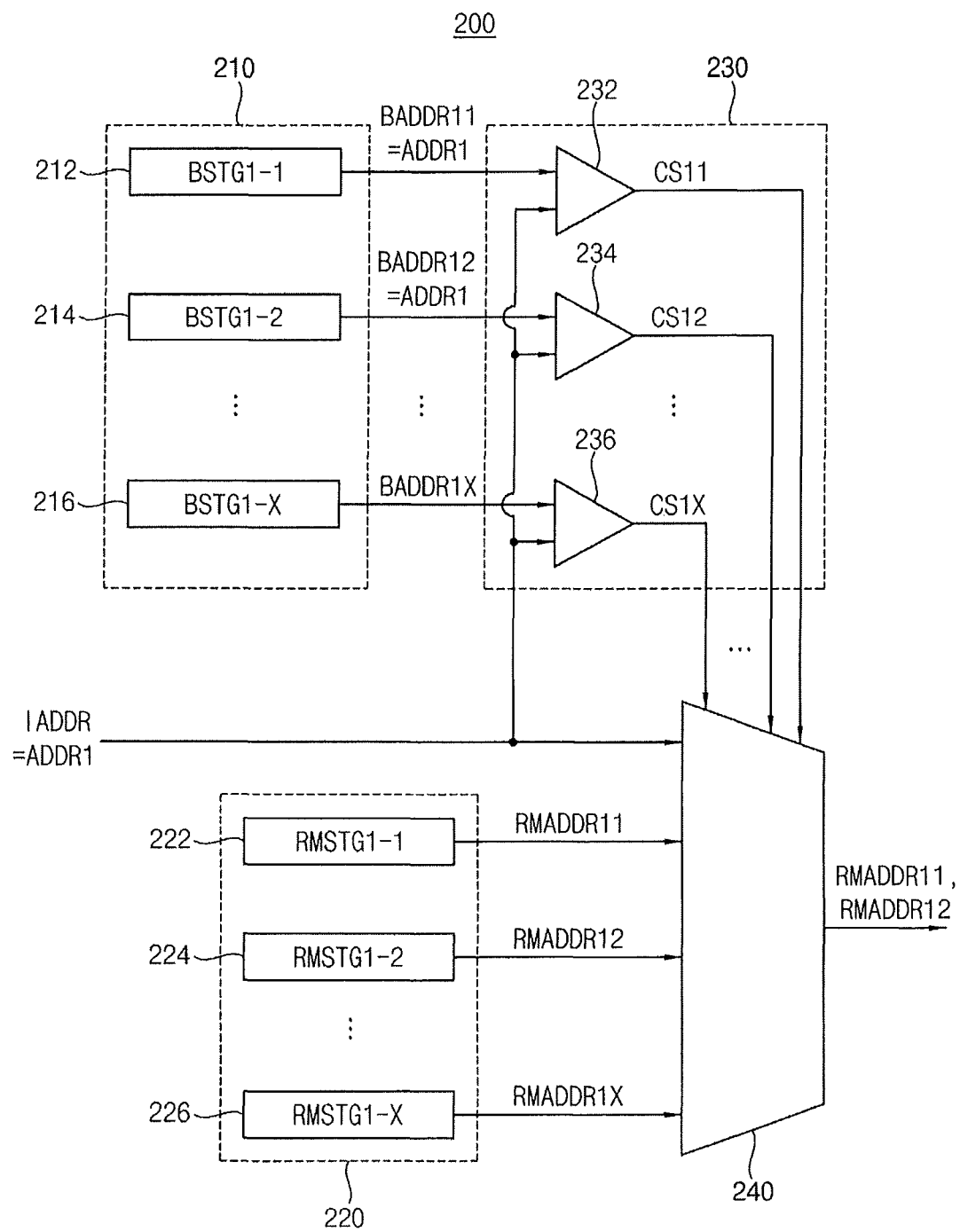
FIGS. 13 and 14 are diagrams for describing an operation of the nonvolatile memory device of FIG. 12, according to example embodiments.
Figure 14:
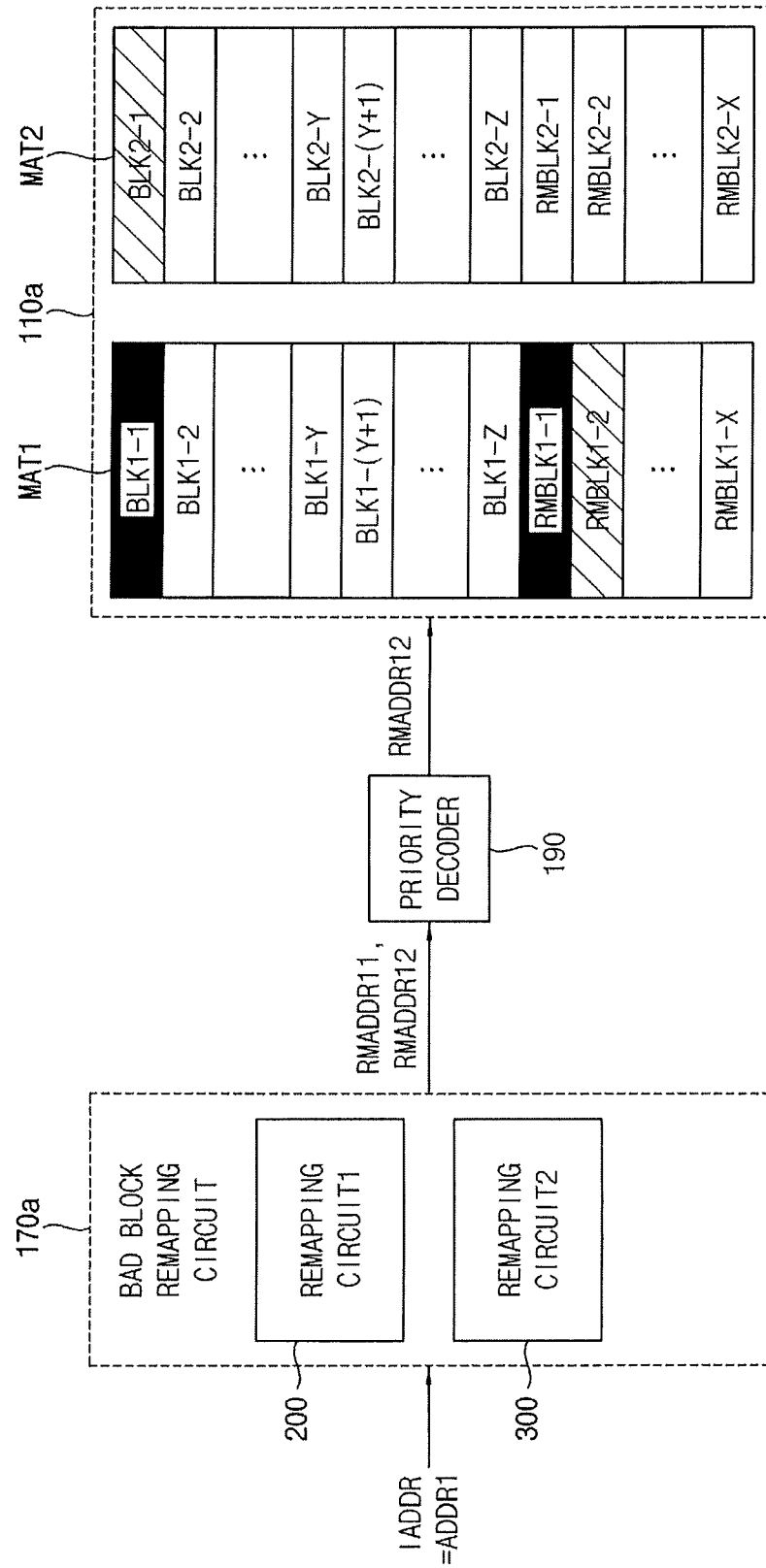

FIGS. 13 and 14 are diagrams for describing an operation of the nonvolatile memory device of FIG. 12. FIGS. 13 and 14 illustrate an example embodiment where the first mat MAT1 includes two defective memory blocks and two defective memory blocks are sequentially detected.

Referring to FIGS. 13 and 14, when the first mat MAT1 includes two or more defective memory blocks for a single address, the bad block remapping circuit 170a may generate two or more remapping addresses based on the input address IADDR.

For example, as illustrated in FIG. 14, when it is determined that the first selection memory block BLK1-1 (e.g., black block in FIG. 14) in the first mat MAT1 is defective, the bad block remapping circuit 170a may store the first address ADDR1 corresponding to the first selection memory block BLK1-1 as the bad block information, and the first selection memory block BLK1-1 may be replaced with the remapping memory block RMBLK1-1. Accordingly, when it is determined that the remapping memory block RMBLK1-1 (e.g., black block in FIG. 14) in the first mat MAT1 is additionally defective, the bad block remapping circuit 170a may further store the first address ADDR1 corresponding to the remapping memory block RMBLK1-1 as the bad block information. Accordingly, when the first address ADDR1 is received as the input address IADDR, the bad block remapping circuit 170a may confirm that the first address ADDR1 is included in the bad block information and may generate remapping addresses RMADDR11 and RMADDR12 based on the first address ADDR1. The priority decoder 190 may compare priority of the remapping addresses RMADDR11 and RMADDR12 with each other to output the remapping address RMADDR12 having higher priority.

Such a remapping operation described with reference to FIG. 14 may be performed by the first remapping circuit 200 included in the bad block remapping circuit 170a. In other words, when the first mat MAT1 includes two defective memory blocks associated with the same single address (e.g., the first address ADDR1), the first remapping circuit 200 may generate the remapping address RMADDR11 based on the first address ADDR1 and may further generate the remapping address RMADDR12 based on the first address ADDR1.

For example, as illustrated in FIG. 13, the first remapping circuit 200 may include a first storage unit 210, a second storage unit 220, a comparing unit 230 and an output unit 240. The first remapping circuit 200 of FIG. 13 may be substantially the same as the first remapping circuit 200 of FIG. 6, and thus duplicated explanation will be omitted.

When it is determined that the first selection memory block BLK1-1 in the first mat MAT1 is defective, the first address ADDR1 corresponding to the first selection memory block BLK1-1 may be stored as the bad address BADDR11 in the bad address storage unit 212. Thus, the first selection memory block BLK1-1 may be replaced with the remapping memory block RMBLK1-1, and then the first address ADDR1 may correspond to the remapping memory block RMBLK1-1.

When it is determined that the remapping memory block RMBLK1-1 in the first mat MAT1 is additionally defective after the first selection memory block BLK1-1 is replaced with the remapping memory block RMBLK1-1, the first address ADDR1 corresponding to the remapping memory block RMBLK1-1 may be stored as the bad address BADDR12 in the bad address storage unit 214. In other words, the bad address storage units 212 and 214 may store the same address ADDR1 as the bad addresses BADDR11 and BADDR12, respectively.

When the first address ADDR1 is received as the input address IADDR, and thus the input address IADDR is substantially the same as the bad addresses BADDR11 and BADDR12 (e.g., if the input address IADDR is hit), the comparison signals CS11 and CS12 having the first logic level may be generated, and the remapping addresses RMADDR11 and RMADDR12 (not the input address IADDR) may be output based on the comparison signals CS11 and CS12.

In some example embodiments, the remapping address RMADDR12 may have a priority higher than a priority of the remapping address RMADDR11. For example, the priority of the remapping addresses RMADDR11~RMADDR1X may be predetermined. For example, in some embodiments, the remapping address RMADDR11 corresponding to the remapping memory block RMBLK1-1 may have the lowest priority, and the remapping address RMADDR1X corresponding to the remapping memory block RMBLK1-X may have the highest priority.

In some example embodiments, the remapping address having a lowest priority may be used first, and a remapping address having a higher priority may be used subsequently. For example, the remapping address RMADDR11 having the lowest priority may be used for a first detected defective memory cell, and thus the first detected defective memory cell may be replaced with the remapping memory block RMBLK1-1. After then, the remapping address RMADDR12 may be used for a second detected defective memory cell, and thus the second detected defective memory cell may be replaced with the remapping memory block RMBLK1-2. In this case, a determination operation of the priority decoder 190 may be relatively efficiently and rapidly performed.

In some example embodiments, the first selection memory block BLK1-1 in FIG. 14 may be an initial bad memory block, for example determined during manufacture, and the remapping memory block RMBLK1-1 in FIG. 14 may be a runtime bad memory block.

The nonvolatile memory device according to example embodiments that operates based on the merged block configuration may further include the priority decoder 190. Although the remapping memory block RMBLK1-1 for replacing the defective memory block BLK1-1 is also defective (e.g., a runtime error), the priority decoder 190 responds by only replacing the memory block RMBLK1-1 having a runtime error with another remapping memory block RMBLK1-2 without duplicated selection. Accordingly, the number of valid memory blocks may be advantageously retained for use, and the number of valid memory blocks available for operation may be thereby increased.

Figure 15:
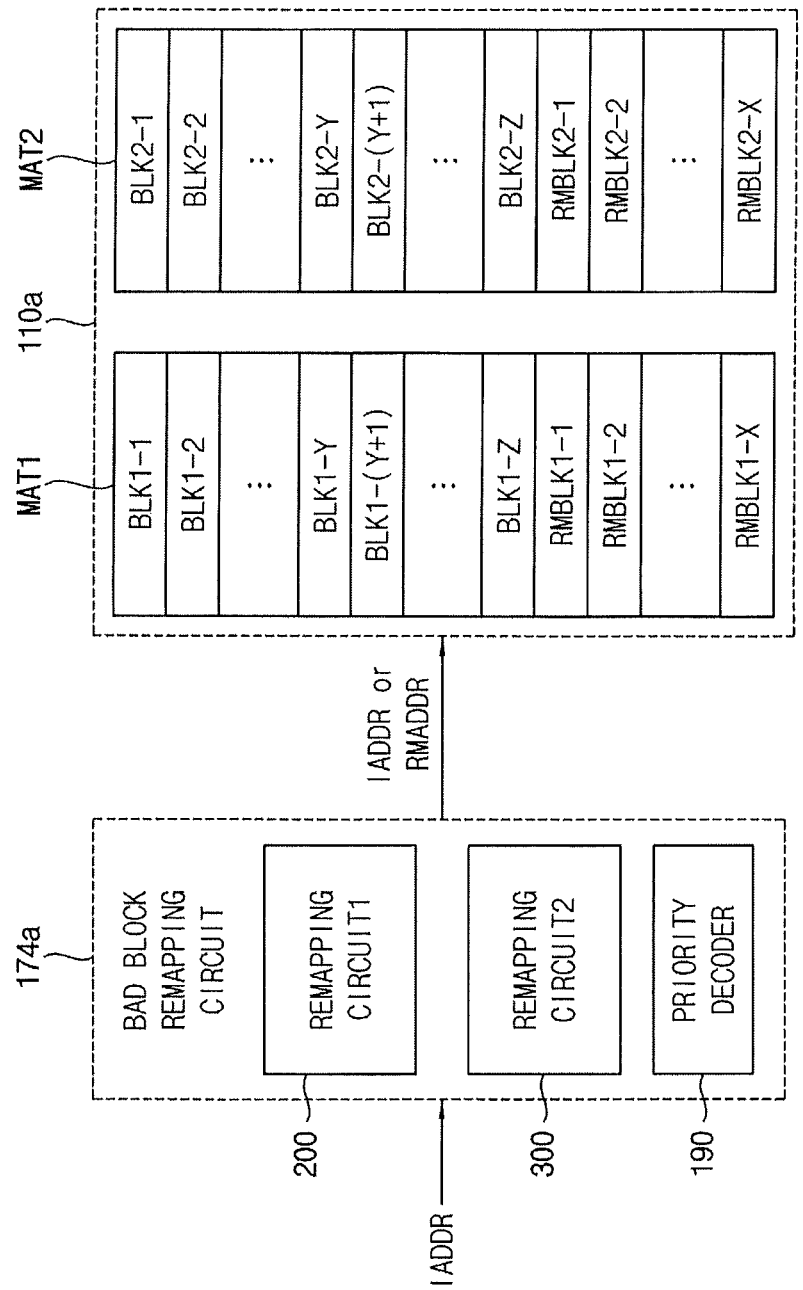
FIGS. 15 and 16 are block diagrams illustrating still other examples of a nonvolatile memory device according to example embodiments.
Figure 16:
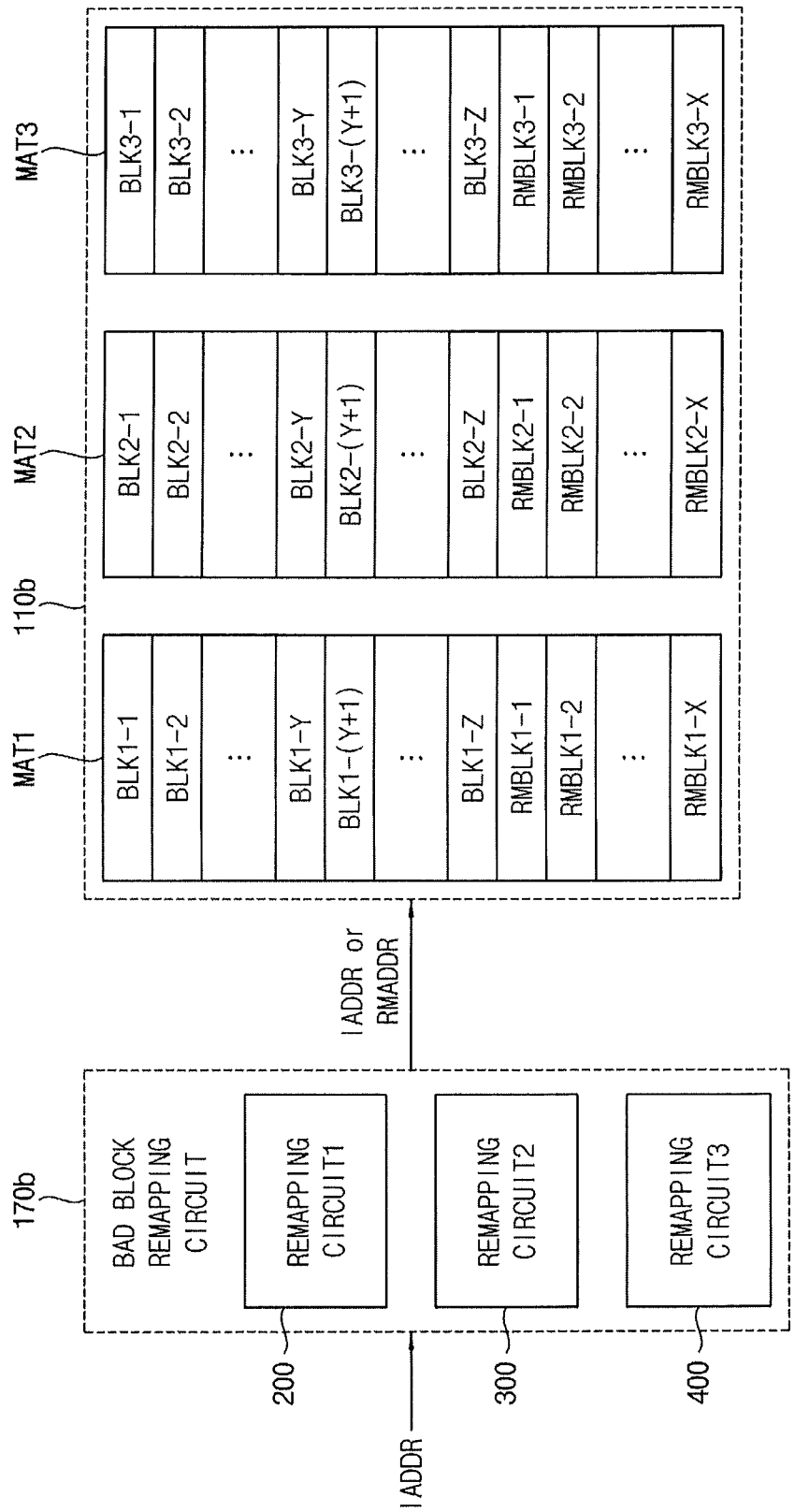

FIGS. 15 and 16 are block diagrams illustrating still other examples of a nonvolatile memory device according to example embodiments.

Referring to FIG. 15, a nonvolatile memory device includes a memory cell array 110a and a bad block remapping circuit 174a.

The nonvolatile memory device of FIG. 15 may be substantially the same as the nonvolatile memory device of FIG. 12, except that the priority decoder 190 is located within, proximal to, or integral with, the bad block remapping circuit 174a in FIG. 15.

Referring to FIG. 16, a nonvolatile memory device includes a memory cell array 110b and a bad block remapping circuit 174b.

In the memory cell array 110b of FIG. 16, three mats are paired with each other. For example, the memory cell array 110b includes a first mat MAT1, a second mat MAT2 and a third mat MAT3 that are paired with each other. The first mat MAT1 and the second mat MAT2 in FIG. 16 may be substantially the same as the first mat MAT1 and the second mat MAT2 in FIG. 4, respectively. The third mat MAT3 includes a plurality of third memory blocks BLK3-1, BLK3-2, . . . , BLK3-Y, BLK3-(Y+1), . . . , BLK3-Z, RMBLK3-1, RMBLK3-2, . . . , RMBLK3-X.

In some example embodiments, the first mat MAT1 may store LSBs of data to be stored into the memory cell array 110b, the second mat MAT2 may store central significant bits (CSB) of the data to be stored into the memory cell array 110b, and the third mat MAT3 may store MSBs of the data to be stored into the memory cell array 110b.

One of the plurality of first memory blocks, one of the plurality of second memory blocks and one of the plurality of third memory blocks are substantially simultaneously accessed based on one of an input address IADDR and a remapping address RMADDR that are provided from the bad block remapping circuit 170b.

The bad block remapping circuit 170b selectively converts the input address IADDR that is received from an external memory controller (e.g., the memory controller 20 in FIG. 1) into the remapping address RMADDR. An operation of the bad block remapping circuit 170b may be substantially the same as the operation of the bad block remapping circuit 170a in FIG. 4. The bad block remapping circuit 170b may include a first remapping circuit 200, a second remapping circuit 300 and a third remapping circuit 400. The first remapping circuit 200 and the second remapping circuit 300 in FIG. 16 may be substantially the same as the first remapping circuit 200 and the second remapping circuit 300 in FIG. 4, respectively. The third remapping circuit 400 may store bad block information and remapping information for the plurality of third memory blocks included in the third mat MAT3. A configuration of the third remapping circuit 400 may be substantially the same as each of the first remapping circuit 200 and the second remapping circuit 300.

Although the present inventive concepts are described based on examples where two or three mats are paired with each other, the present inventive concepts may be adopted to an example where a memory cell array includes any number of mats that are paired with each other, for example, greater than three mats paired with each other.

Figure 17A:
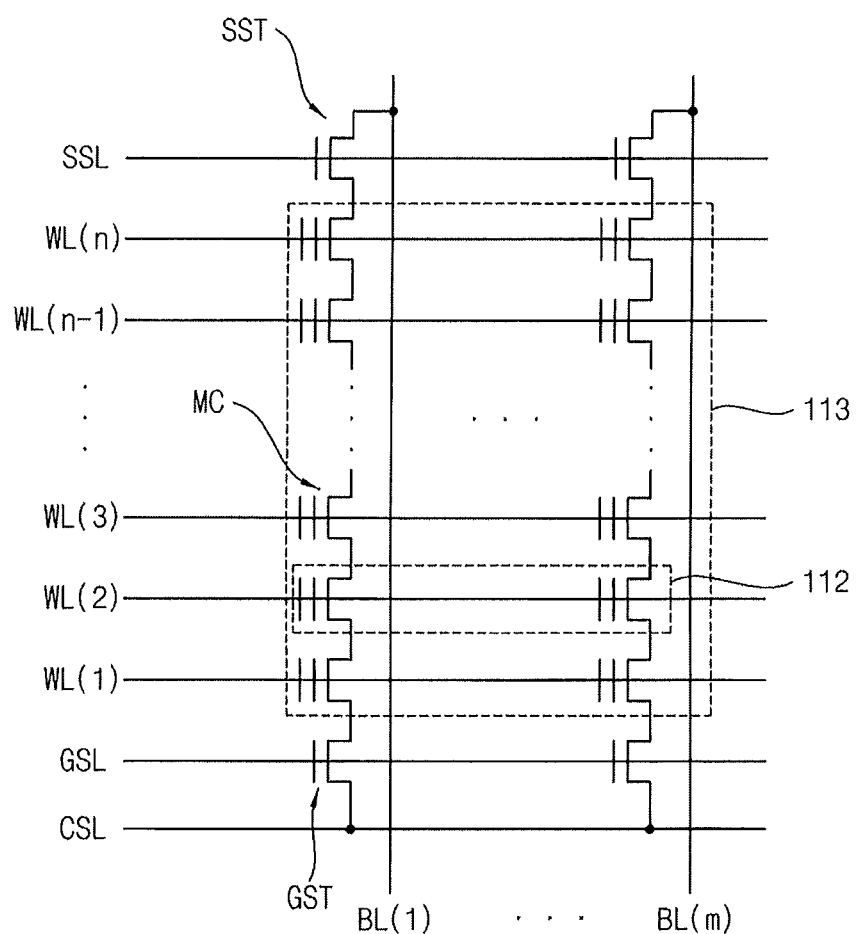
FIGS. 17A and 17B are diagrams illustrating examples of a memory cell array included in a nonvolatile memory device according to example embodiments.
Figure 17B:
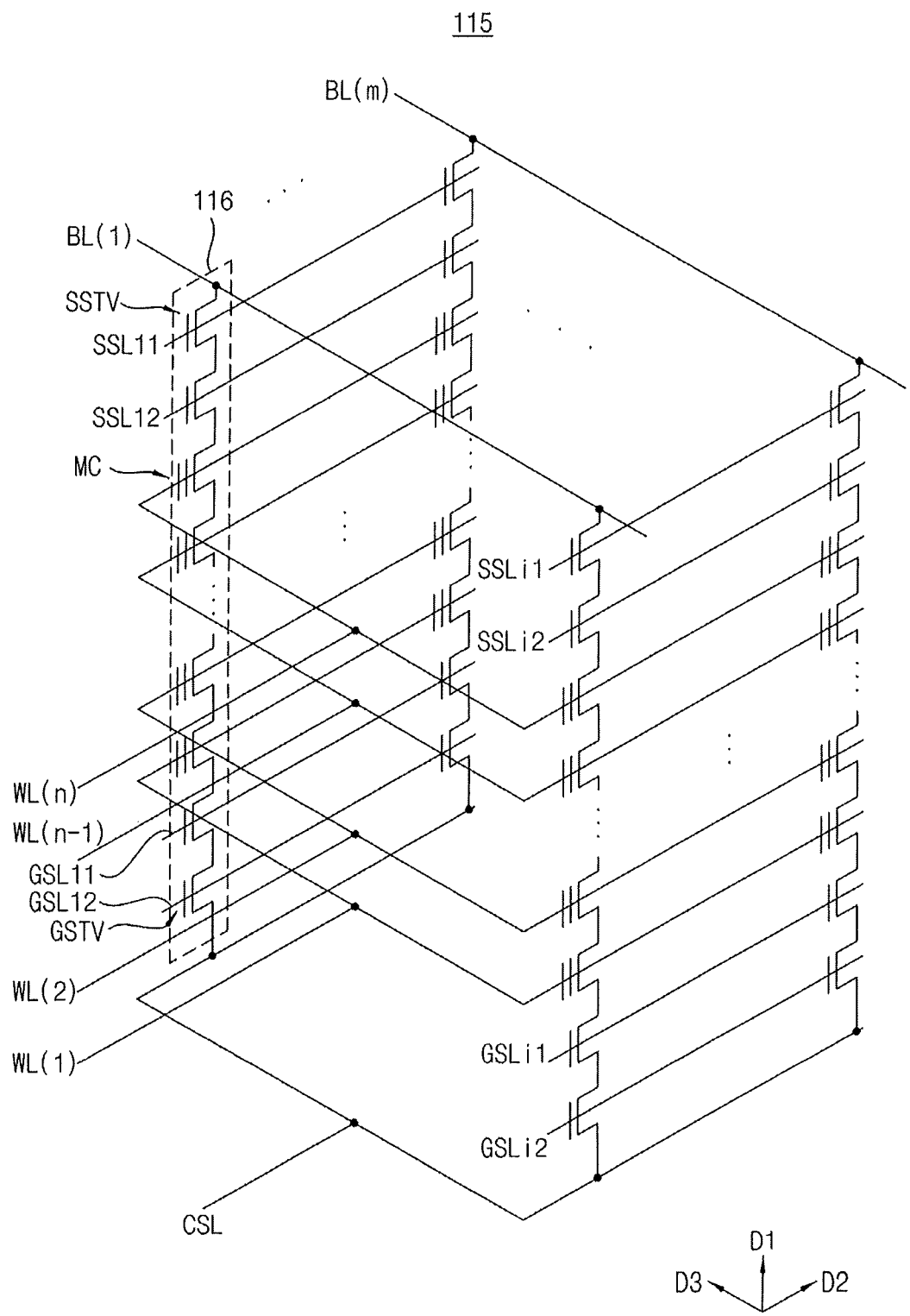

FIGS. 17A and 17B are diagrams illustrating examples of a memory cell array included in a nonvolatile memory device according to example embodiments. FIG. 17A is a circuit diagram illustrating an example of a memory cell array included in a NAND flash memory device. FIG. 17B is a circuit diagram illustrating an example of a memory cell array included in a vertical NAND flash memory device.

Referring to FIG. 17A, a memory cell array 111 may include string selection transistors SST, ground selection transistors GST and memory cells MC. The string selection transistors SST may be connected to bitlines BL(1), . . . , BL(m), and the ground selection transistors GST may be connected to a common source line CSL. The memory cells arranged in the same row may be disposed in series between one of the bitlines BL(1)~BL(m) and the common source line CSL, and the memory cells arranged in the same column may be connected in common to one of wordlines WL(1), WL(2), WL(3), . . . , WL(n-1), WL(n). In other words, the memory cells MC may be connected in series between the string selection transistors SST and the ground selection transistors GST, and the 16, 32 or 64 wordlines may be disposed between a string selection line SSL and a ground selection line GSL.

The string selection transistors SST may be connected to the string selection line SSL such that the string selection transistors SST are controlled according to a level of a voltage applied from the string selection line SSL. The memory cells MC may be controlled according to levels of voltages applied to the wordlines WL(1)~WL(n).

The NAND flash memory device including the memory cell array 111 may perform the data read and write operations in units of page 112 and the data erase operation in units of block 113. In some example embodiments, each of page buffers may be connected to even and odd bitlines one by one. In this case, the even bitlines than an even page, the odd bitlines form an odd page, and the data write operation for the memory cells MC of the even and odd pages may be performed by turns and sequentially.

Referring to FIG. 17B, a memory cell array 115 may include a plurality of strings 116 having a vertical structure. The plurality of strings 116 may be formed in a second direction D2 such that a string row may be formed. A plurality of string rows may be formed in a third direction D3 such that a string array may be formed. Each of the strings 116 may include ground selection transistors GSTV, memory cells MC and string selection transistors SSTV which are disposed in series in a first direction D1 between bitlines BL(1), . . . , BL(m) and a common source line CSL.

The ground selection transistors GSTV may be connected to ground selection lines GSL11, GSL12, . . . , GSLi1, GSLi2, respectively, and the string selection transistors SSTV may be connected to string selection lines SSL11, SSL12, . . . , SSLi1, SSLi2, respectively. The memory cells arranged on the same layer may be connected in common to one of wordlines WL(1), WL(2), . . . , WL(n-1), WL(n). The ground selection lines GSL11~GSLi2 and the string selection lines SSL11~SSLi2 may extend in the second direction D2 and may be formed along the third direction D3. The wordlines WL(1)~WL(n) may extend in the second direction D2 and may be formed along the first and third directions D1 and D3. The bitlines BL(1)~BL(m) may extend in the third direction D3 and may be formed along the second direction D2. The memory cells MC may be controlled according to levels of voltages applied to the wordlines WL(1)~WL(n).

In some example embodiments, it may be implemented that two string selection transistors included in one string 116 are connected to one string selection line, and two ground selection transistors included in one string are connected to one ground selection line. In other example embodiments, it may be implemented that one string 116 includes one string selection transistor and one ground selection transistor.

A three dimensional (3-D) vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3-D vertical array structure, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 18:
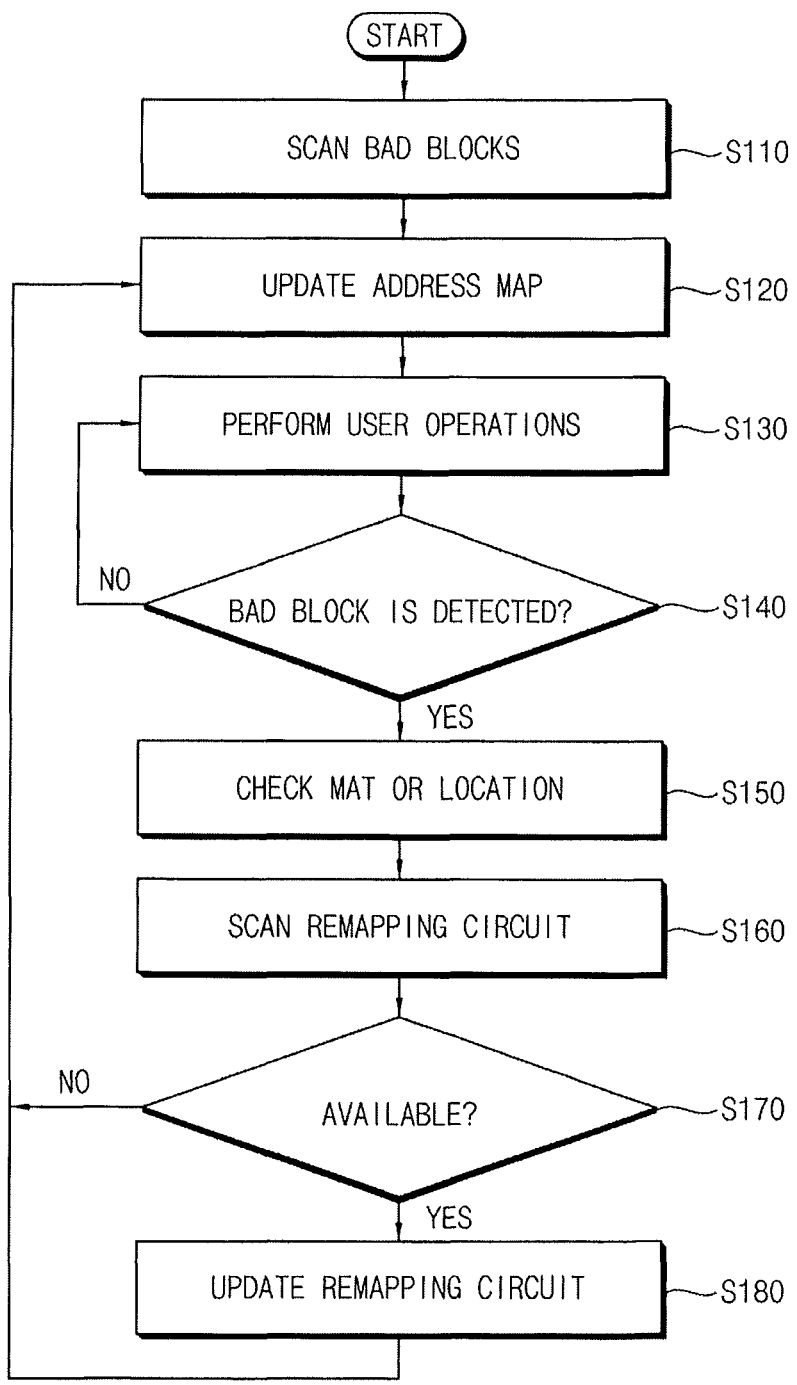
FIG. 18 is a flow chart illustrating a method of operating a memory system according to example embodiments.

FIG. 18 is a flow chart illustrating a method of operating a memory system according to example embodiments.

Referring to FIGS. 1 and 18, in a method of operating the memory system 10 according to example embodiments, at an initial operation time, a power supply voltage is applied to the memory controller 20 and the nonvolatile memory device 100 included in the memory system 10. After the power supply voltage is applied, defective memory blocks or bad memory blocks are scanned (step S110). The status of the bad block information of the nonvolatile memory device 100 may be determined by step S110. For example, when the bad block remapping circuit 170 is in a disabled status, an address corresponding to an initial defective memory block or an initial bad memory block may be detected. When the bad block remapping circuit 170 is in an enabled status, a remapping address may be detected.

An address map is updated based on a result of scanning (step S120). For example, the address map may be used for an operation of the memory controller 20 and may be stored in the memory controller 20 or the nonvolatile memory device 100.

User operations are performed based on a result of steps S110 and S120 (step S130). For example, various operations such as data program/read/erase operations may be performed for the nonvolatile memory device 100.

When an additional defective memory block or an additional bad memory block is not detected (step S140: NO), the user operations are continuously and repeatedly performed.

When an additional defective memory block or an additional bad memory block that has a runtime error is detected during the user operations (step S140: YES), a specific mat including the defective memory block and/or a location of the defective memory block is identified (step S150) because the nonvolatile memory device 100 operates based on the merged block configuration and the remapping operation is performed in a single mat basis. For example, the specific mat including the defective memory block and/or the location of the defective memory block may be identified by exiting a mat merging mode or entering a single mat selecting mode.

After the specific mat including the defective memory block and/or the location of the defective memory block is identified, a remapping circuit corresponding to the mat including the defective memory block is scanned for checking available space (step S160). For example, it may be determined whether bad address storage units in the remapping circuit are available and/or whether remapping addresses and remapping memory blocks in the memory cell array are available.

When the remapping circuit is unavailable (step S170: NO), the address map is updated such that the defective memory block can not be used (step S120), and the user operations are performed based on the updated address map (step S130).

When the remapping circuit is available (step S170: YES), the bad block remapping circuit 170 performs the remapping operation described with reference to FIGS. 4 through 16, and thus the bad block remapping circuit 170 is updated (step S180). After then, the address map is updated based on the remapping address such that the defective memory block is replaced with the remapping memory block (step S120), and the user operations are performed based on the updated address map (step S130).

In some example embodiments, each step in FIG. 18 may be performed based on a control of the memory controller 20.

Figure 19:
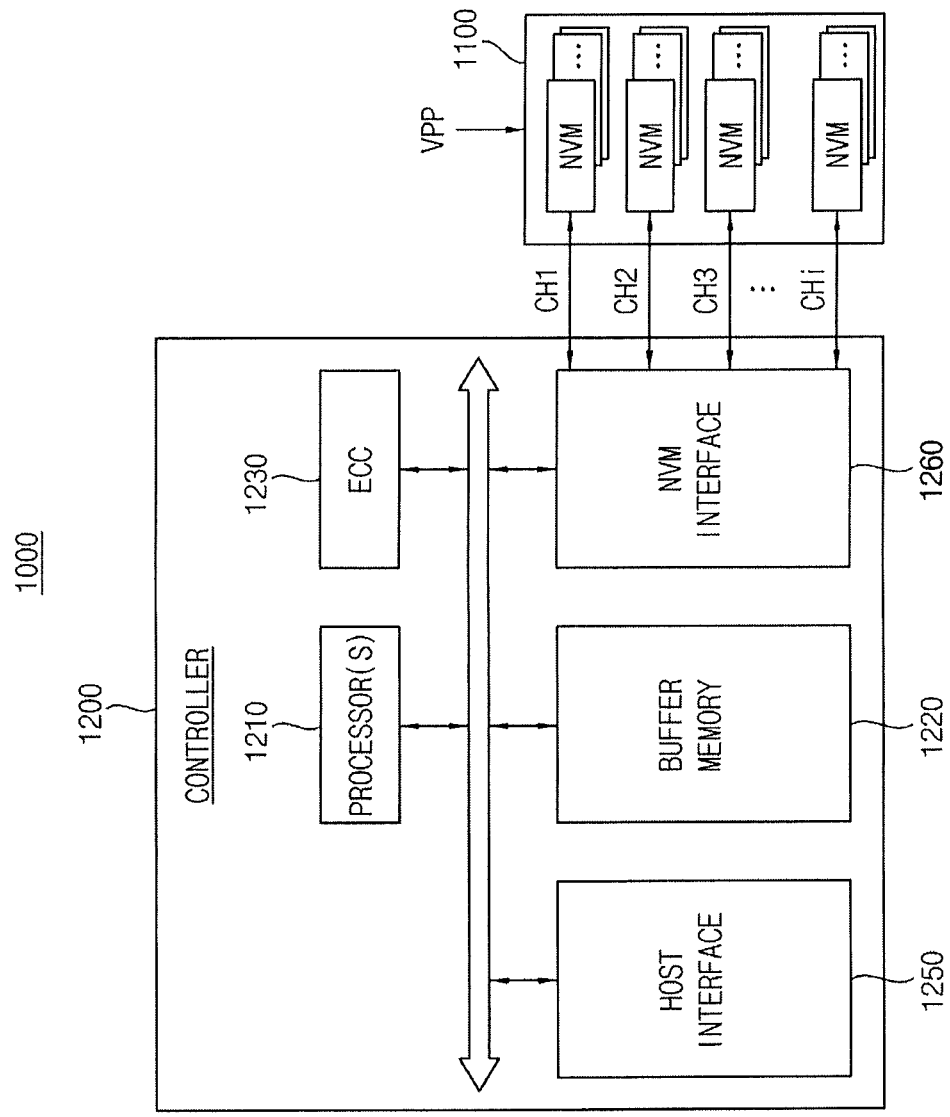
FIG. 19 is a block diagram illustrating a solid state disc or solid state drive (SSD) according to example embodiments.

FIG. 19 is a block diagram illustrating a solid state disc or solid state drive (SSD) according to example embodiments.

Referring to FIG. 19, a SSD 1000 includes multiple nonvolatile memory devices 1100 and a SSD controller 1200.

The SSD controller 1200 may be connected to the nonvolatile memory devices 1100 through multiple channels CH1, CH2, CH3, . . . CHi. The SSD controller 1200 may include one or more processors 1210, a buffer memory 1220, an error correction code (ECC) circuit 1230, a host interface 1250, and a nonvolatile memory interface 1260.

The buffer memory 1220 may store data used to drive the SSD controller 1200. The buffer memory 1220 may include multiple memory lines each storing data or a command. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may be the nonvolatile memory device according to example embodiments and may be optionally supplied with an external high voltage VPP.

The present disclosure may be applied to various devices and systems that include the nonvolatile memory device. For example, the present disclosure may be applied to systems such as a mobile phone, a smart phone, a tablet computer, a laptop computer, a personal digital assistants (PDA), a portable multimedia player (PMP), a digital camera, a portable game console, a music player, a camcorder, a video player, a navigation device, a wearable device, an internet of things (IoT) device, an internet of everything (IoE) device, an e-book, a virtual reality (VR) device, an augmented reality (AR) device, a robotic device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
a memory cell array including a first mat and a second mat that are paired with each other, the first mat including a plurality of first memory blocks, the second mat including a plurality of second memory blocks, a first selection memory block among the plurality of first memory blocks and a second selection memory block among the plurality of second memory blocks being accessed based on a first address; and
a bad block remapping circuit configured to generate a first remapping address based on the first address when it is determined that the first selection memory block is defective,
wherein a first remapping memory block among the plurality of first memory blocks and the second selection memory block are accessed based on the first remapping address,
wherein the bad block remapping circuit comprises:
a first storage unit configured to store a plurality of bad addresses that represent defective memory blocks in the first and second mats, the first storage unit comprising a plurality of storage units configured to store the plurality of bad addresses, respectively;
a second storage unit separate from the first storage unit configured to store the first remapping address;
a comparing unit configured to compare an input address from an external device with the plurality of bad addresses and generate a plurality of comparison signals; and
an output unit configured to output one of the input address and the first remapping address based on the plurality of comparison signals.

2. The nonvolatile memory device of claim 1, wherein a third selection memory block among the plurality of first memory blocks and a fourth selection memory block among the plurality of second memory blocks are accessed based on a second address different from the first address,
wherein the bad block remapping circuit is configured to generate a second remapping address based on the second address when it is determined that the fourth selection memory block is defective, and wherein the third selection memory block and a second remapping memory block among the plurality of second memory blocks are accessed based on the second remapping address.

3. The nonvolatile memory device of claim 2, wherein the first selection memory block and the fourth selection memory block are arranged as a pair of bad memory blocks.

4. The nonvolatile memory device of claim 2, wherein the bad block remapping circuit includes:
  a first remapping circuit configured to replace the input address with the first remapping address when the input address received from the external device is substantially the same as at least one of the plurality of bad addresses; and
  a second remapping circuit configured to replace the input address with the second remapping address when the input address is substantially the same as at least one of the plurality of bad addresses.

5. The nonvolatile memory device of claim 1, wherein the output unit is configured to output the first remapping address when the input address is substantially the same as at least one of the plurality of bad addresses, and
  wherein the output unit is configured to output the input address when the input address is different from the plurality of bad addresses.

6. The nonvolatile memory device of claim 1, wherein the second storage unit includes:
  a plurality of fuses, each of which stores a respective one bit of the first remapping address.

7. The nonvolatile memory device of claim 1, further comprising:
  a determining circuit configured to determine whether the bad block remapping circuit is enabled or disabled.

8. The nonvolatile memory device of claim 7, wherein the determining circuit is integral with the bad block remapping circuit.

9. The nonvolatile memory device of claim 1, wherein the first selection memory block is an initial bad memory block in which a defect occurs during a manufacturing process of the nonvolatile memory device.

10. The nonvolatile memory device of claim 1, wherein the bad block remapping circuit is configured to further generate a second remapping address based on the first address when it is determined that the first remapping memory block is defective,
  wherein the second remapping address has a priority higher than a priority of the first remapping address,
  wherein the nonvolatile memory device further includes:
  a priority decoder configured to compare the priority of the first remapping address with the priority of the second remapping address to output the second remapping address.

11. The nonvolatile memory device of claim 10, wherein the first remapping memory block is a runtime bad memory block in which a defect occurs after a manufacturing process of the nonvolatile memory device and during usage of the nonvolatile memory device.

12. The nonvolatile memory device of claim 1, wherein the first mat is configured to store least significant bits (LSBs) of data to be stored into the memory cell array, and
  wherein the second mat is configured to store most significant bits (MSBs) of the data to be stored into the memory cell array.

13. The nonvolatile memory device of claim 1, wherein the memory cell array further includes:
  a third mat including a plurality of third memory blocks, the first mat, the second mat and the third mat being paired with each other,
  wherein the first selection memory block, the second selection memory block and a third selection memory block among the plurality of third memory blocks are accessed based on the first address,
  wherein the first remapping memory block, the second selection memory block and the third selection memory block are accessed based on the first remapping address.

14. A memory system comprising:
  a memory controller; and
  a nonvolatile memory device controlled by the memory controller, the nonvolatile memory device comprising:
  a memory cell array including a first mat and a second mat that are paired with each other, the first mat including a plurality of first memory blocks, the second mat including a plurality of second memory blocks, a first selection memory block among the plurality of first memory blocks and a second selection memory block among the plurality of second memory blocks being accessed based on a first address; and
  a bad block remapping circuit configured to generate a first remapping address based on the first address when it is determined that the first selection memory block is defective,
  wherein a first remapping memory block among the plurality of first memory blocks and the second selection memory block are accessed based on the first remapping address, and
  wherein the bad block remapping circuit comprises a first storage unit including a plurality of storage units for storing a plurality of bad addresses, respectively, that represent defective memory blocks in the first and second mats, a second storage unit separate from the first storage unit configured to store the first remapping address, a comparing unit configured to compare an input address with the plurality of bad addresses and generate a plurality of comparison signals, and an output unit configured to receive the first remapping address from the second storage unit and to output one of an input address and the first remapping address based on the plurality of comparison signals.

15. A nonvolatile memory device comprising:
  a memory cell array including a first mat and a second mat that are paired with each other, the first mat including a plurality of first memory blocks, the second mat including a plurality of second memory blocks, an initial one of the first plurality of memory blocks and a corresponding initial one of the second plurality of memory blocks initially assigned to correspond with each other during normal operation of the nonvolatile memory device as merged blocks accessible based on a first address; and
  a bad block remapping circuit configured to reassign a first remapping memory block of the first memory blocks to correspond with the corresponding initial one of the second memory blocks in response to a determination that the initial one of the first memory blocks is defective, the first remapping memory block of the first memory blocks and the initial one of the second memory blocks accessible based on the first address,
  wherein the bad block remapping circuit comprises a first storage unit including a plurality of storage units for storing a plurality of bad addresses, respectively, that represent defective memory blocks in the first and second mats, a second storage unit separate from the first storage unit configured to store a first remapping address, a comparing unit configured to compare an input address with the plurality of bad addresses and generate a plurality of comparison signals, and an output unit configured to receive the first remapping address from the second storage unit and to output one of an input address and the first remapping address based on the plurality of comparison signals.

16. The nonvolatile memory device of claim 15 wherein the bad block remapping circuit reassigns the first remapping memory block of the first memory blocks by generating the first remapping address based on the first address, and
wherein the first remapping memory block of the first memory blocks and the initial one of the second memory blocks are accessible based on the first remapping address.

17. The nonvolatile memory device of claim 15 wherein the bad block remapping circuit is further configured to reassign a first remapping memory block of the second memory blocks to correspond with the corresponding initial one of the first memory blocks in response to a determination that the initial one of the second memory blocks is defective, the first remapping memory block of the second memory blocks and the initial one of the first memory blocks accessible based on the first address.

18. The nonvolatile memory device of claim 15, wherein the first mat is configured to store least significant bits (LSBs) of data to be stored into the memory cell array, and
wherein the second mat is configured to store most significant bits (MSBs) of the data to be stored into the memory cell array.

19. The nonvolatile memory device of claim 15 wherein the bad block remapping circuit is further configured to reassign a second remapping memory block of the first memory blocks to correspond with a corresponding initial second one of the second memory blocks in response to a determination that the initial second one of the first memory blocks is defective, the corresponding second remapping memory block of the first memory blocks and the initial second one of the second memory blocks accessible based on the first address.

* * * * *